US012569949B2

(12) United States Patent
Sato et al.

(10) Patent No.: US 12,569,949 B2
(45) Date of Patent: Mar. 10, 2026

(54) SUBSTRATE PROCESSING APPARATUS

(71) Applicant: TDK CORPORATION, Tokyo (JP)

(72) Inventors: Yohei Sato, Tokyo (JP); Hiroshi Koizumi, Tokyo (JP); Toshinobu Miyagoshi, Tokyo (JP); Osamu Shindo, Tokyo (JP); Seijiro Sunaga, Tokyo (JP); Makoto Yamashita, Tokyo (JP); Yasuo Kato, Tokyo (JP); Mitsuyoshi Makida, Tokyo (JP); Masashi Matsumoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 379 days.

(21) Appl. No.: 18/323,618

(22) Filed: May 25, 2023

(65) Prior Publication Data

US 2023/0381904 A1      Nov. 30, 2023

(30) Foreign Application Priority Data

May 26, 2022      (JP) ................................ 2022-086033

(51) Int. Cl.
 B23Q 3/02          (2006.01)
 H01L 21/603        (2006.01)
(52) U.S. Cl.
 CPC .............. B23Q 3/02 (2013.01); H01L 21/603
                                                   (2021.08)

(58) Field of Classification Search
 CPC ............. H01L 21/603; H01L 21/67144; H01L 21/6875; H01L 21/68771; H01L 21/68785; H01L 2224/75701; H01L 2224/75704; H01L 2224/7598; H01L 2224/75986–75988; H01L 24/75; B23Q 3/02
 See application file for complete search history.

(56) References Cited

U.S. PATENT DOCUMENTS

2012/0024456 A1* 2/2012 Lin ................... H01L 21/67109
                                                                156/64
2012/0247664 A1* 10/2012 Kobayashi ............. H01L 24/75
                                                                156/308.2

FOREIGN PATENT DOCUMENTS

JP        2010-232234 A      10/2010
KR    10-2018-0038968 A       4/2018

* cited by examiner

*Primary Examiner* — Tyrone V Hall, Jr.
(74) *Attorney, Agent, or Firm* — Oliff PLC

(57) ABSTRACT

A substrate processing apparatus 10 having a lower jig plate 46 for arranging a substrate 2 as an object to be pressurized, a support member 45 including an installation portion 52 for installing columnar members 50 supporting the lower jig plate 46, in which the columnar members 50 are placed to the installation portion 52 in accordance with a in-plane distribution of a load applied to the lower jig plate 46.

12 Claims, 20 Drawing Sheets

SUBSTRATE PROCESSING APPARATUS

BACKGROUND OF THE INVENTION

The present disclosure relates to a substrate processing apparatus for processing a substrate, for example, on which a plurality of elements is arranged.

In a technology of forming an element array including a plurality of elements on a substrate, in order to improve mechanical bonding strength and bonding stability between the plurality of elements and the substrate, a substrate processing apparatus is used to press the plurality of elements using a flat plate against the substrate on which the plurality of elements is arranged (Patent Document 1).

As a substrate processing apparatus that executes this type of processing, for example, a substrate processing apparatus which includes a lower jig plate on which an object to be pressurized (a substrate on which a plurality of elements is arranged) is arranged, and an upper jig plate that pressurizes the object arranged on the lower jig plate is used. When the substrate on which the plurality of elements is arranged is pressed using the upper jig plate while being provided on the lower jig plate, load is applied to the substrate, and accordingly, the plurality of elements can be pressed against the substrate.

In recent years, a size (height) of an element arranged on a substrate has become as small as about several µm. When parallelism, flatness, and the like of a surface of the lower jig plate or the upper jig plate vary by about several µm, it becomes difficult to apply a uniform load to the plurality of elements on the substrate using the upper jig plate, and a bonding failure may occur between the plurality of elements and the substrate.

Also, when the substrate is pressed using the upper jig plate, the lower jig plate and so on may bend to some degree, and it becomes difficult to apply uniform load to the substrate. Therefore, when no load is applied, even if parallelism, flatness, and the like of the surfaces of the upper jig plate and the lower jig plate can be secured to some extent, bonding failure may occur between the plurality of elements and the substrate due to non-uniform distribution of load when pressure is applied to the substrate.

[Patent Document 1] Japanese Patent Application Laid-Open No. 2010-232234

BRIEF SUMMARY OF INVENTION

The present disclosure has been made in view of such circumstances, and an object of the present disclosure is to provide a substrate processing apparatus capable of applying uniform amount of load to an object to be pressurized.

In order to achieve the above object, the substrate processing apparatus according to the present invention includes a lower jig plate for arranging an object to be pressurized, a support member including columnar members supporting the lower jig plate and an installation portion for installing the columnar members, wherein the columnar members are placed to the installation portion in accordance with an in-plane distribution of a load applied to the lower jig plate.

A substrate processing apparatus according to the present disclosure includes a support member which includes columnar members supporting the lower jig plate and also includes the columnar members supporting the lower jig plate, and the columnar members can be installed to the installation portion in accordance with an in-plane distribution of load applied to the lower jig plate. For example, at a position where a relatively smaller load is applied to the lower jig plate, by installing the columnar members to the installation portion so that a relatively larger supporting force can be provided to the lower jig plate by the supporting member, the lower jig plate bends less, and load applied to the lower jig plate can be increased. Also, at a position where relatively large load is applied to the lower jig plate, by installing the columnar members to the installation portion so that relatively small supporting force is provided to the lower jig plate by the supporting member, the lower jig plate bends easily, and load applied to the lower jig plate can be decreased. Thereby, bending of the lower jig plate can be adjusted so that load applied to each position of the lower jig plate is balanced out, and uniform load can be applied to the object.

Also, by installing the columnar members to the installation portion, the positions of the columnar members can be determined easily and also the position shifting of the columnar members can be prevented, hence the lower jig plate can be supported by the columnar members in a stable condition.

Note that, as a means to apply uniform load to the object, from the viewpoint of making an amount of bending of the lower jig plate to substantially zero when the load is applied, a means for forming the lower jig plate using a high rigidity material or the like, a means for fixing the lower jig plate to a rigid (high rigidity) frame, or the like may be used. However, when such means are used, size, weight, or cost of the substrate processing apparatus may increase. Also, in the conventional technology, it was technically difficult to suppress the amount of bending of the lower jig plate to several µm or so. In the substrate processing apparatus according to the present disclosure, by allowing the lower jig plate to bend and also by flexibly adjusting the amount of bending of the lower jig plate, uniform load can be applied to the object by a simple means.

Preferably, the installation portion may include installation holes for installing the columnar members. By taking such configuration, just by installing each of the columnar members to the respective installation holes, the columnar members can be positioned to the appropriate position in accordance with the in-plane distribution of load applied to the lower jig plate.

Preferably, diameters of the installation holes may vary in accordance with the in-plane distribution of a load applied to the lower jig plate. For example, at the position where a relatively small load is applied to the lower jig plate, by making the diameter of the installation hole large to install a columnar member with a large diameter, a large supporting force is provided to the lower jig plate by the support member to make the lower jig plate bend less, and load applied to the lower jig plate can be increased. Also, at the position where a relatively large load is applied to the lower jig plate, by making a diameter of the installation hole small to install a columnar member with small diameter, the lower jig plate bends easily, and load applied to the lower jig plate can be decreased. Thereby, bending of the lower jig plate can be adjusted so that load applied to each position of the lower jig plate is balanced out, and uniform load can be applied to the object.

Preferably, the installation holes may be arranged concentrically. By installing columnar members to the installation holes arranged concentrically, and concentrically arranging the columnar members, bending of the lower jig plate can be easily adjusted so that load applied to each position of the lower jig plate is balanced out, and uniform load can be effectively applied to the object.

One of the columnar members may be joined to the lower jig plate by using a joining member. By configuring as such, one of the columnar members can be firmly fixed to the lower jig plate using the joining member, hence, the lower jig plate bends less at the position where the one of the columnar members are arranged, and load applied to the lower jig plate can be increased effectively.

Preferably, the one of the columnar members joined to the lower jig plate by using the joining member may be arranged under a pressurizing shaft for applying pressure to the object. At the lower end of the pressurizing shaft, in some cases the load applied to the lower jig plate may become relatively small due to bending of the lower jig plate. By joining the lower jig plate and the columnar member arranged using the joining member at such position, bending of the lower jig plate can be effectively prevented at said position.

One of the columnar members may be joined to the lower jig plate and the installation portion by using the joining member. By joining one of the columnar members with the installation portion in addition to the lower jig plate, bending of the lower jig plate can be effectively prevented at the position where said columnar member is arranged.

The columnar members may include at least one selected from a first columnar member and a second columnar member, in which the first columnar member is joined to the installation portion using a joining member and is provided to the lower jig plate without using the joining member, and the second columnar member is provided between the lower jig plate and the installation portion without using the joining member. By arranging such columnar members at the positions where load applied to the lower jig plate is relatively large, the lower jig plate can bend easily and load applied to the lower jig plate can be decreased.

Preferably, the substrate processing apparatus further includes a heat dissipating member and at least one of the first columnar member and the second columnar member may be provided under the lower jig plate via the heat dissipating member. By configuring as such, heat of the lower jig plate can be transferred to the columnar members via the heat dissipating member, and also heat can be released to outside through the columnar members.

DETAILED DESCRIPTION OF INVENTION

Hereinafter, the present disclosure is described based on embodiments shown in the figures.

Figure 1A:
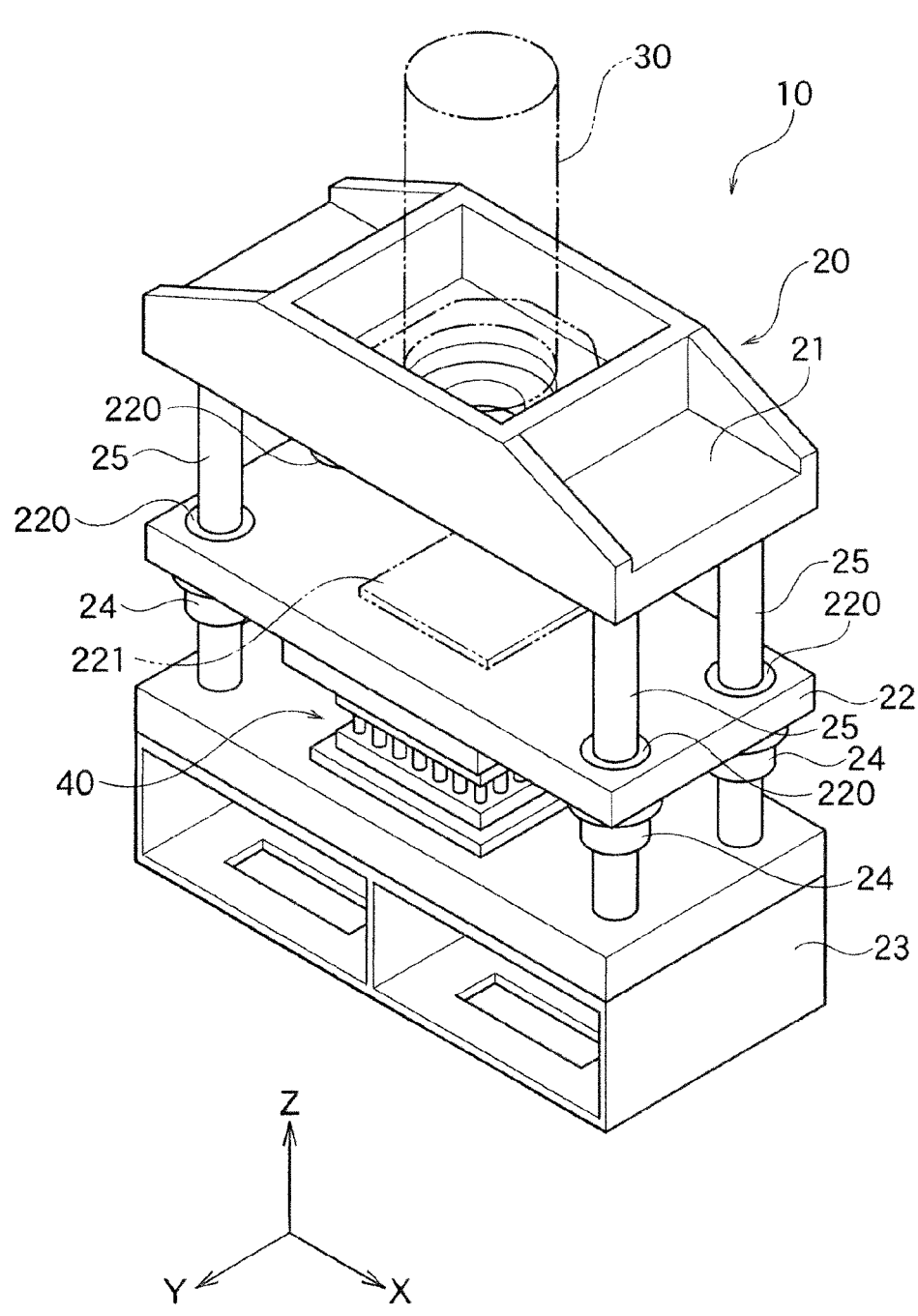
FIG. 1A is a perspective view of a substrate processing apparatus according to an embodiment of the present disclosure.

As shown in FIG. 1A, a substrate processing apparatus 10 according to an embodiment of the present disclosure is an apparatus for forming an element array 4 (FIG. 2) including elements 4a, 4b, and 4c on a substrate 2, and the substrate processing apparatus 10 presses the elements 4a, 4b, and 4c using a predetermined means against the substrate 2 on which the elements 4a, 4b, and 4c are arranged. Thereby, mechanical bonding strength and bonding stability between the substrate 2 and the elements 4a, 4b, and 4c can be enhanced. That is, the substrate processing apparatus 10 functions as a pressurizing portion (pressurizing device) when forming the element array 4 on the substrate 2.

As a material of the substrate 2, for example, a glass epoxy material may be mentioned. Note that, the material of the substrate 2 is not limited thereto, and for example, the substrate 2 may be made of $SiO_2$ or $Al_2O_3$ as a glass substrate; or it may be a flexible substrate made of elastomers such as polyimide, polyamide, polypropylene, polyetheretherketone, urethane, silicone, polyethylene terephthalate, polyethylene naphthalate, or so; furthermore the substrate 2 may be a glass wool.

For example, a conductive bonding material, which is not shown in the figures, may be formed on the surface of the substrate 2 in advance. Due to anisotropic conductive particle connection, bump compression connection, or the like, this conductive bonding material electrically and mechanically connects the substrate 2 and the elements 4a, 4b, and 4c; and the conductive bonding material is cured by heating. As examples of the conductive bonding material, ACF, ACP, NCF, NCP, and the like may be mentioned. A thickness of the conductive bonding material may preferably be within a range of 1.0 to 10000 μm.

Circuit patterns are formed in a predetermined pattern on the substrate 2, and electrodes of the elements 4a, 4b, and 4c can be connected to the circuit patterns via the conductive bonding material.

The elements 4a, 4b, and 4c are arranged on the substrate 2 in an array form. An array form means that the elements 4a, 4b, and 4c are arranged in rows and columns according to a predetermined pattern, and spaces in the row direction and the column direction may be the same or different.

The elements 4a, 4b, and 4c are arranged as RGB pixels on a substrate for a display, and are arranged on a light emitting substrate as a backlight emitter. The element 4a is a red light emitting element, the element 4b is a green light emitting element, and the element 4c is a blue light emitting element. Note that, the elements arranged on the substrate 2 are not limited to these elements.

The elements 4a, 4b, and 4c of the present embodiment are micro light emitting elements (micro LED elements), and the size (width×length) thereof may, for example, be within a range of 5 μm×5 μm to 50 μm×50 μm. The thicknesses (heights) of the elements 4a to 4c may, for example, be 50 μm or less.

The substrate processing apparatus 10 includes a pedestal 20, a load generating portion 30, and a substrate pressurizing portion 40. In the figures, X axis corresponds to a width direction of the pedestal 20, Y axis corresponds to a depth direction of the pedestal 20, and Z axis corresponds to a height direction of the pedestal 20.

The pedestal 20 may be formed of, for example, a metal case, and includes a pedestal upper portion 21, a movable pressurizing portion 22, a pedestal lower portion 23, a guide bush 24, and a guide shaft 25. The pedestal lower portion 23 constitutes a base portion (table) of the pedestal 20 and has a predetermined height. In the example shown in the figures, a hollow portion is formed at inside of the pedestal lower portion 23. However, the shape of the pedestal lower portion 23 is not limited thereto, and inside of the pedestal lower portion 23 may be solid.

Lower ends of the four guide shafts 25 are fixed (inserted) to the four corners of the pedestal lower portion 23. These guide shafts 25 each have a predetermined length and is arranged so that it is standing upright in the Z-axis direction. A lower end of each guide shaft 25 is fixed to the pedestal lower portion 23, and an upper end of each guide shaft 25 is fixed to the pedestal upper portion 21. The guide shaft 25 penetrates the four corners of the movable pressurizing portion 22 arranged between the pedestal upper portion 21 and the pedestal lower portion 23. These guide shafts 25 function to support the pedestal upper portion 21 and also function to support the movable pressurizing portion 22 so that it can slide up and down in the Z-axis direction.

Figure 1B:
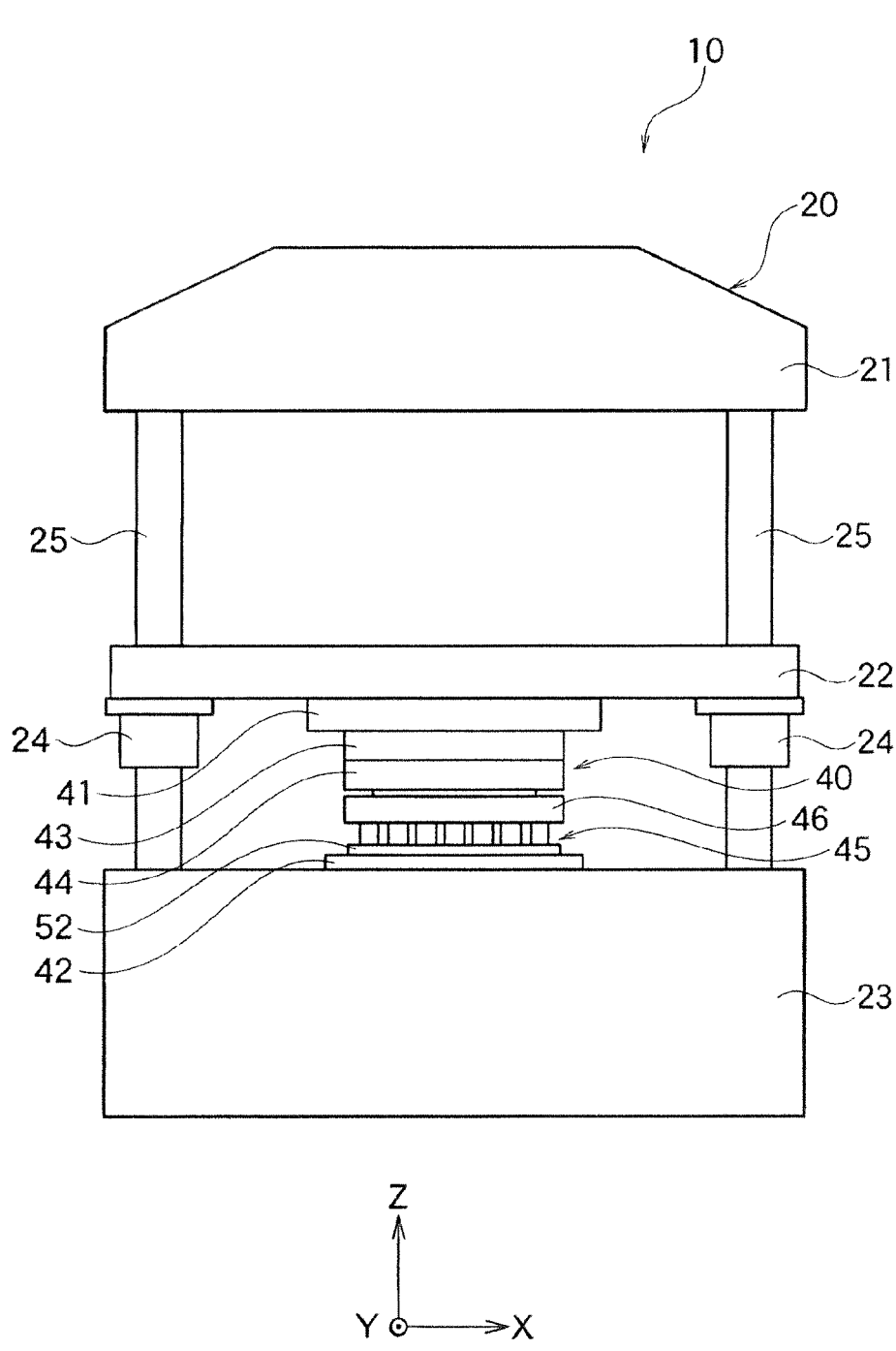
FIG. 1B is a side view of the substrate processing apparatus shown in FIG. 1A.

The movable pressurizing portion 22 is a plate-shaped body (rigid body) having a rectangular shape, and is positioned between the pedestal lower portion 23 and the pedestal upper portion 21. The movable pressurizing portion 22 is configured so that it can slide in a vertical direction along the four guide shafts 25 by receiving load from the load generating portion 30. As shown in FIG. 1B, the movable pressurizing portion 22 contacts with an upper face of the substrate pressurizing portion 40 and applies pressure thereto, thereby, for example, load of about 0 to 100 kN or so is applied to the substrate pressurizing portion 40. Preferably, the movable pressurizing portion 22 may be parallel to the substrate pressurizing portion 40 and is in contact with the substrate pressurizing portion, and parallelism A of the movable pressurizing portion 22 against the substrate pressurizing portion 40 may preferably be within a range of $1 \mu m \leq A < 2 \mu m$.

As shown in FIG. 1A, four through holes 220 are respectively formed at four corners of the movable pressurizing portion 22, and four guide shafts 25 are respectively inserted into the through holes 220. Four guide bushes 24 are fixed to the lower face (the face on the Z-axis negative direction side) of the movable pressurizing portion 22 at positions matching the four through holes 220. When the movable pressurizing portion 22 is moving in the vertical direction, the guide bush 24 functions to improve sliding of the movable pressurizing portion 22 (reduces friction against the guide shaft 25) and also functions to easily determine the position of the guide shaft 25 against the axis of the through hole 220.

The pedestal upper portion 21 configures a ceiling portion of the pedestal 20. The upper ends of the four guide shafts 25 are fixed (inserted) to the four corners of the lower face of the pedestal upper portion 21. A load generating portion 30 is fixed to a center portion of the pedestal upper portion 21. The load generating portion 30 is constituted by a device such as a pressurizing cylinder, a servo press, a motor, an actuator, or so, and functions to apply load to the movable pressurizing portion 22. Note that, in order to prevent the figures from becoming too complicated, the detailed configuration of the movable pressurizing portion 22 is not shown, and the configuration is only partly shown.

The load generating portion 30 applies load to the movable pressurizing portion 22 by applying pressure to a center area 221 of the movable pressurizing portion 22 using a press head (not shown in the figures). Thereby, the movable pressurizing portion 22 moves downward and applies pressure to the substrate pressurizing portion 40. As a result, the substrate pressurizing portion 40 can apply load to the object (the substrate 2 on which the elements 4a, 4b, 4c are arranged).

Figure 3A:
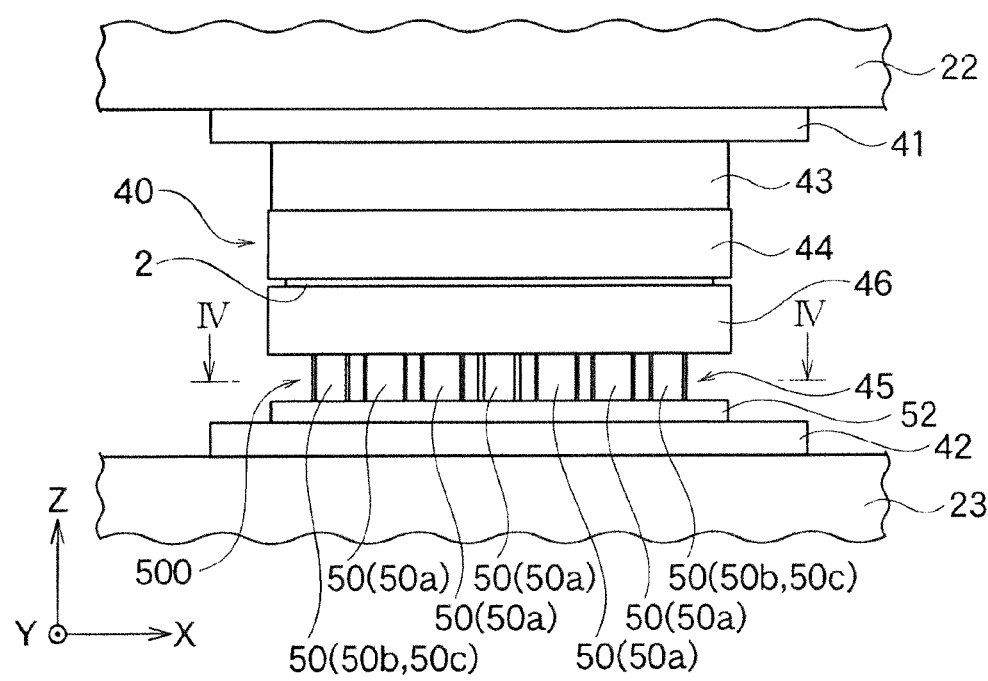
FIG. 3A is an enlarged side view of a substrate pressing portion of the substrate processing apparatus shown in FIG. 1A.

As shown in FIG. 3A, the substrate pressurizing portion 40 includes an upper stage 41, a lower stage 42, an upper mounting portion 43, an upper jig plate 44, a support member 45, and a lower jig plate 46. The upper stage 41 is provided on the lower face of the movable pressurizing portion 22, and the lower stage 42 is provided on the upper face of the pedestal lower portion 23. A thickness of each of the upper stage 41 and the lower stage 42 is thicker than the thickness of the substrate 2. The upper stage 41 and the lower stage 42 have the same shapes, and a width of each of these in the X-axis direction is wider than widths of the upper mounting portion 43 and the support member 45 in the X-axis direction. Note that, the shapes of the upper stage 41 and the lower stage 42 are not limited to the shapes shown in the figures, and may be changed appropriately.

Preferably, the upper stage 41 may be formed of a flat plate-shaped body (rigid body) having a relatively high surface accuracy (for example, flatness, smoothness, or the like). For example, preferably a surface accuracy of the upper face of the upper stage 41 may be better than a surface accuracy of the lower face of the movable pressurizing portion 22; that is, in the upper surface of the upper stage 41, preferably unevenness may be less (i.e. smoother) and less angled against the horizontal plane (i.e. flatter) than the lower surface of the movable pressurizing portion 22.

As such, by fixing the upper stage 41 having excellent surface accuracy to the lower face of the movable pressurizing portion 22, when the upper mounting portion 43 is fixed to the lower face of the upper stage 41, the upper mounting portion 43 or the upper jig plate 44 mounted thereon can be stably arranged without being angled against the horizontal plane.

Preferably, the lower stage 42 may be a flat plate-shaped body (rigid body) and is preferably formed of a member having relatively high surface accuracy (for example, flatness, smoothness, or the like). For example, preferably the surface accuracy of the upper face of the lower stage 42 may be better than the surface accuracy of the upper face of the pedestal lower portion 23; that is, in the upper surface of the lower stage 42, preferably unevenness may be less (i.e. smoother) and less angled against the horizontal plane (i.e. flatter) than the upper surface of the pedestal lower portion 23.

As such, by fixing the lower stage 42 having excellent surface accuracy to the upper face of the pedestal lower portion 23, when the support member 45 is fixed to the upper face of the lower stage 42, the support member 45 or the lower jig plate 46 supported by the support member 45 can be stably arranged without being angled against the horizontal plane.

The upper mounting portion 43 has an appearance of a flat plate-like shape and is fixed to the lower face of the upper stage 41. The upper jig plate 44 is mounted on the upper mounting portion 43. The upper mounting portion 43 functions to support the upper jig plate 44.

The upper jig plate 44 is a flat plate-shaped body (rigid body) and is fixed (mounted) to the lower face of the upper mounting portion 43. The upper jig plate 44 functions to apply pressure on the substrate 2 arranged on the lower jig plate 46. A heating function (for example, a heater) is built in the upper jig plate 44, and when the substrate 2 is pressed by the upper jig plate 44, the substrate 2 can be heated by the upper jig plate 44. For example, when the conductive bonding material is used to connect the elements 4a, 4b, and 4c with the substrate 2, the elements 4a, 4b, and 4c can be firmly connected to the substrate 2 by heating the substrate 2, and bonding force between the substrate 2 and the elements 4a, 4b, and 4c arranged thereon can be enhanced.

Preferably, the upper jig plate 44 may be formed of a member having relatively high surface accuracy. Preferably, the surface accuracy of the lower face of the upper jig plate 44 may be, for example, better than the surface accuracy of the lower face of the upper stage 41, that is, in the lower surface of the upper jig plate 44, preferably unevenness may be less (i.e. smoother) and less angled against the horizontal plane (i.e. flatter) than the lower surface of the upper stage 41. A surface roughness Ra of the surface (particularly, the lower face) of the upper jig plate 44 may particularly preferably be Ra≤1 μm.

As such, by improving the surface accuracy of the upper jig plate 44, when the substrate 2 arranged on the lower jig plate 46 is pressed by the lower face of the upper jig plate 44, unevenness of load applied to the substrate 2 can be reduced, and a uniform load can be applied to the elements 4a, 4b, and 4c arranged on the substrate 2.

The lower jig plate 46 is a flat plate-shaped body (rigid body) and it is supported by the support member 45. The lower jig plate 46 and the upper jig plate 44 are about the same shapes, and the lower jig plate 46 and the upper jig plate 44 face against each other. The substrate 2, which is an object to be pressed, can be arranged on the lower jig plate 46. As similar to the upper jig plate 44, a heating function (for example, a heater) is built in the lower jig plate 46, and when the substrate 2 is pressed by the upper jig plate 44, the substrate 2 can be heated by the lower jig plate 46 (and the upper jig plate 44).

Preferably, the lower jig plate 46 may be formed of a member having relatively high surface accuracy. Preferably, the surface accuracy of the upper face of the lower jig plate 46 may be better than the surface accuracy of the upper face of the lower stage 42; that is, in the upper face of the lower jig plate 46, preferably unevenness may be less (i.e. smoother) and less angled against the horizontal plane (i.e. flatter) than the upper surface of the lower stage 42.

A surface roughness Ra of the surface (particularly, the upper face) of the lower jig plate 46 may preferably be Ra≤1 μm, as similar to the surface roughness Ra of the surface of the upper jig plate 44. Also, parallelism A between the lower jig plate 46 and the upper jig plate 44 may preferably be A≤1 μm.

As such, by improving the surface accuracy of the lower jig plate 46, when the substrate 2 arranged on the lower jig plate 46 is pressed by the lower face of the upper jig plate 44, the lower face of the upper jig plate 44 and the substrate 2 become parallel to each other (contact with each other), and the above-mentioned effect of enhancing uniform distribution of load applied to the substrate 2 can be obtained.

Even if a certain level of surface accuracy of the upper jig plate 44 and the lower jig plate 46 is secured, when the substrate 2 is pressurized using the upper jig plate 44, the lower jig plate 46 is bent to some extent, and the lower jig plate 46 and the upper jig plate 44 may not have sufficient contact property (adhesive property). Thus, it may become difficult to apply uniform load to the substrate 2 (or to the elements 4a, 4b, and 4c arranged on the substrate 2), and the bonding condition between the substrate 2 and the elements 4a, 4b and 4c may vary.

That is, in relativity, the substrate 2 has an area where load changes in decreasing direction when a small surface pressure is applied, and an area where load changes in increasing direction when a large surface pressure is applied, hence the load distribution of substrate 2 becomes non-uniform. Therefore, in the substrate processing apparatus 10 according to the present embodiment, the support member 45 is provided with a means for solving the non-uniform load distribution when pressure is applied to the substrate 2. Hereinafter, the support me fiber 45 will be described in detail.

The support member 45 is fixed to the upper face of the lower stage 42 and supports the lower jig plate 46. That is, in the present embodiment, the lower jig plate 46 is provided above the lower stage 42 by having the support member 45 in between. The support member 45 is configured so that it can adjust the amount of load applied on the substrate 2 which is caused by bending of the above-mentioned lower jig plate 46; and the support member 45 provides a support force to the lower jig plate 46 in accordance with the in-plane distribution of the load applied to the lower jig plate 46.

For example, in the lower jig plate 46, the closer a position is to a center of the lower jig plate 46, the more the lower jig plate 46 is bent in a concave shape and protrudes downward, the surface pressure applied to the position becomes relatively small. Thus, the load applied to the lower jig plate 46 may become relatively small in some cases. As such, at the position where load applied to the lower jig plate 46 is relatively small, the support member 45 provides a relatively large supporting force to the lower jig plate 46. Thereby, at a position close to the center area of the lower jig plate 46, the lower jig plate 46 bends less, and load applied to the lower jig plate 46 can be increased. As a result, load applied to the substrate 2 arranged on the lower jig plate 46 at this position can be increased.

Also, as the position of the lower jig plate 46 is farther away from the center area thereof, the surface pressure applied to the position becomes relatively large, and the applied load may become relatively large. As such, at a position where the load applied to the lower jig plate 46 becomes relatively large, the support member 45 provides a small supporting force to the lower jig plate 46. Thereby, at the position farther away from the center area of the lower jig plate 46, the lower jig plate 46 bends easily, and load applied to the lower jig plate 46 can be reduced. As a result, load applied to the substrate 2 arranged on the lower jig plate 46 at the position can be reduced.

As such, the support member 45 adjusts bending of the lower jig plate 46 so that load applied to each position of the lower jig plate 46 are balanced out, and uniform load can be applied to the substrate 2. Hereinafter, a specific means for providing the lower jig plate 46 with a supporting force in accordance with the in-plane distribution of load of the lower jig plate 46 using the support member 45 will be described.

The support member 45 includes a collective body 500 of columnar members 50 and an installation portion 52 where the columnar members 50 are placed. The columnar members 50 each have a columnar shape and function to support the lower jig plate 46. The shape of columnar member 50 is not limited thereto, and it may be a triangular prism shape, a square prism shape, any another polygonal prism shape, a cone shape, a triangular pyramid shape, or any another polygonal pyramid shape. The columnar member 50 may be a hollow shape.

Figure 4:
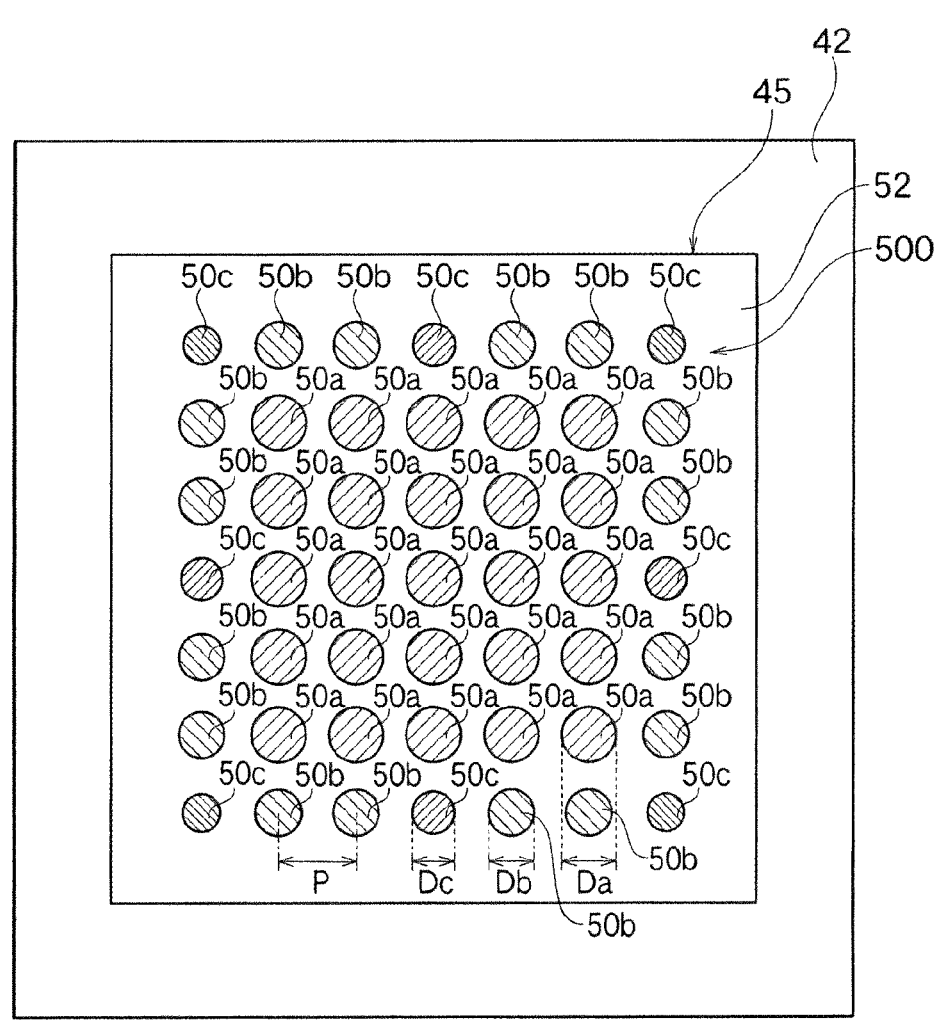
FIG. 4 is a cross sectional view of the substrate pressing portion shown in FIG. 3A along a line IV-IV.
Figure 4:
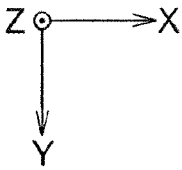

Preferably, the columnar members 50 may be formed of a resiliently deformable solid body. As shown in FIG. 4, for example, the columnar members 50 are orderly arranged in a matrix form of 7 rows and 7 columns on the installation portion 52, and the columnar members 50 are arranged by taking predetermined space between each other in the X-axis direction and the Y-axis direction. In the example shown in the figures, the center distances between each of the columnar members 50 are substantially the same, and the columnar members 50 are arranged taking equal space between each other, but the space between the columnar members 50 do not necessarily have to be the same. Also, when viewed from above, the columnar members 50 are evenly arranged from one end to the other end throughout X-axis direction and Y-axis direction of the installation portion 52, but the columnar members 50 may be unevenly distributed (concentrated) in part of the installation portion 52.

Also, the columnar members 50 may be arranged randomly on the installation portion 52 or may be arranged concentrically. The arrangement of the columnar members 50 is appropriately determined according to the in-plane distribution of the load applied to the lower jig plate 46.

In the present embodiment, the columnar members 50 do not necessarily all have the same cross sectional areas (cross sectional areas parallel to the XY plane), and the columnar members 50 include a columnar member 50 having a relatively large cross sectional area (a columnar member 50a), a columnar member 50 having a relatively small cross sectional area (a columnar member 50c), and a columnar member 50 having a cross sectional area which is between these two (a columnar member 50b). That is, the columnar members 50 are formed of a plurality of members having different shapes.

The columnar members 50a are arranged at positions where load applied to the lower jig plate 46 is relatively small, and the columnar members 50b and 50c are arranged at positions where load applied to the lower jig plate 46 is relatively large. That is, the columnar members 50a, 50b, and 50c are arranged in accordance with the in-plane distribution of load applied to the lower jig plate 46.

In the example shown in the figures, the columnar members 50a are arranged on the installation portion 52 in a matrix form of 5 rows and 5 columns. In below, the columnar member 50a positioned at the center of the collective body of columnar members 50a may be specifically referred to as a columnar member 50a1. The columnar member 50a1 is arranged roughly at the center of the lower jig plate 46 (directly below the pressurizing shaft of the load generating portion 30). Note that, the pressurizing shaft may be configured of a single shaft or a plurality of shafts.

The columnar members 50b and the columnar members 50c are arranged at the outside of the collective body of columnar members 50a (the outermost periphery of the collective body 500) and surround the collective body. At the outermost periphery of the collective body 500, four columnar members 50c are arranged at four corners, and four more columnar members 50c are arranged between said four columnar members 50c. Further, two columnar members 50b are arranged in pairs between the columnar members 50c. The arrangement of the columnar members 50a, 50b, and 50c shown in FIG. 4 is an example, and the arrangement thereof may be appropriately changed.

When a width (diameter) of the columnar member 50a is Da, a width (diameter) of the columnar member 50b is Db, and a width (diameter) of the columnar member 50c is Dc, then Da>Db>Dc is satisfied. The diameters Da, Db, and Dc are preferably within a range of 10 to 20 mm. Also, a ratio Da/Dc is preferably within a range of 2/1 to 1.5/1 which is a ratio between the diameter Da of the columnar member 50a with largest diameter to the diameter Dc of the columnar member 50c with smallest diameter. By setting the diameter (thickness) of each of the columnar members 50a, 50b, and 50c within such range, each of the columnar members 50a, 50b, and 50c can bend appropriately in accordance with the magnitude or in-plane distribution of load applied to the lower jig plate 46.

Note that, among the columnar members 50a, a diameter of the columnar member 50a1 may be larger than that of other columnar members 50a so that the columnar member 50a1 becomes harder to bend compared to other columnar members 50a.

A center distance (pitch) P between the columnar members 50 may preferably be within a range of 20 to 50 mm, and more preferably within a range of 20 to 25 mm By setting the center distance P between the columnar members 50 within such range, the columnar members 50a, 50b, and 50c can evenly support the entire lower jig plate 46, and the lower jig plate 46 can be supported with an appropriate supporting force. In the present embodiment, at the positions where the columnar members 50a, 50b, and 50c are arranged, a supporting force can be locally provided to the lower jig plate 46 by the columnar members 50a, 50b, and 50c.

A length L of the columnar members 50 may preferably be within a range of 20 to 50 mm, and more preferably within a range of 20 to 25 mm. The length L of the columnar members 50 may be substantially the same as the height of the lower jig plate 46.

When a cross sectional area of the columnar member 50a is Sa, a cross sectional area of the columnar member 50b is Sb, and a cross sectional area of the columnar member 50c is Sc, then Sa>Sb>Sc is satisfied. The cross sectional area Sa of the columnar member 50a arranged at a position where load applied to the lower jig plate 46 is relatively small is larger than the cross sectional areas Sb and Sc of the columnar members 50b and 50c arranged at positions where load applied to lower jig plate 46 is relatively large.

In the case that the lower jig plate 46 is supported by the columnar members 50a, 50b, and 50c, load is applied to the lower jig plate 46 (FIG. 3A) by applying pressure to the substrate 2 using the upper jig plate 44 (FIG. 3A), and load is applied to the columnar members 50a, 50b, and 50c; a relatively small amount of strain (compression strain in the Z-axis negative direction) is generated to the columnar member 50a. At the same time, relatively large amount of strain (compression strain in the Z-axis negative direction) is generated to the columnar members 50b and 50c. As such, in the present embodiment, when load is applied to the columnar members 50a, 50b, and 50c, strain is generated to the columnar members 50a, 50b, and 50c by an amount of strain in accordance with these cross sectional area Sa, Sb, and Sc.

The columnar members 50a, 50b, and 50c can freely expand and contract along an extending direction thereof by deforming in accordance with the cross-sectional area thereof when load is applied. The moment at which the columnar members 50a, 50b, and 50c deform by receiving load is roughly the same as the moment at which the lower jig plate 46 receives load from the upper jig plate 44, the moment at which the upper jig plate 44 receives load from the movable pressurizing portion 22, or the moment at which the movable pressurizing portion 22 receives load from the load generating portion 30. When no load is applied to the columnar members 50a, 50b, and 50c, the columnar members 50a, 50b, and 50c are not deformed and these are at the original state.

In the present embodiment, the amount of strain of the columnar member 50a arranged at a position where a relatively small load is applied to the lower jig plate 46 is smaller than the amounts of strain of the columnar members 50b and 50c arranged at positions where a relatively large load is applied to the lower jig plate 46. That is, in the columnar members 50, a strain gradient is formed in accordance with the in-plane distribution of load applied to the lower jig plate 46; and the closer the columnar member 50 is arranged to the center of the lower jig plate 46, the smaller the strain is; and the closer the columnar member 50 is arranged to the outer periphery of the lower jig plate 46, the larger the strain is.

Figure 3B:
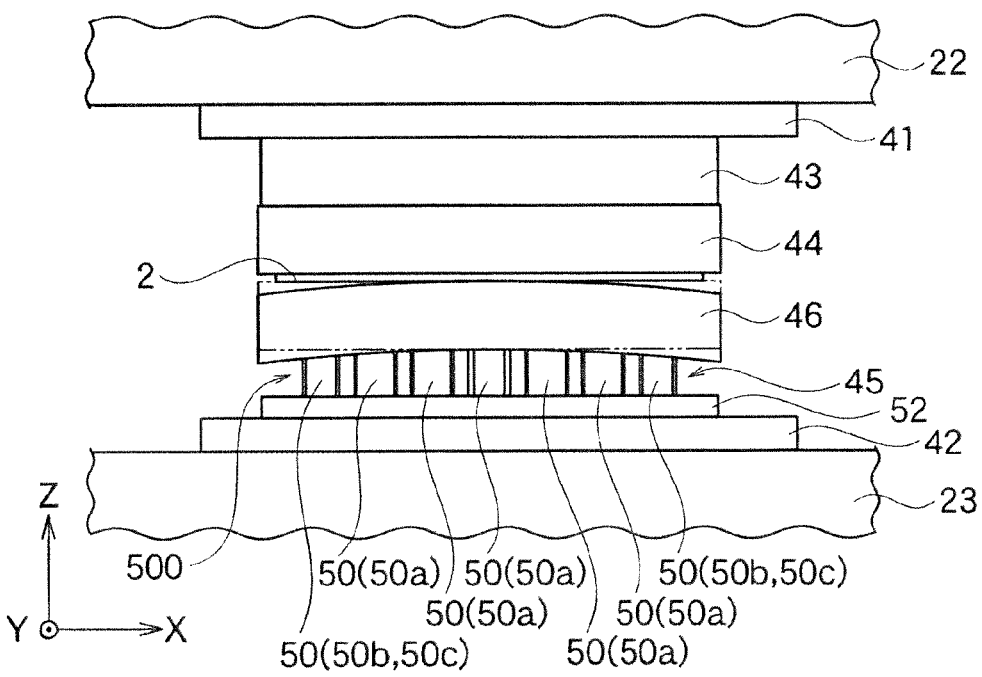
FIG. 3B is an enlarged side view showing when the lower jig plate of the substrate pressing portion shown in FIG. 3A is bent.

By supporting the lower jig plate 46 with the columnar member 50a having a relatively small strain amount at a position where load applied to the lower jig plate 46 is relatively small, a relatively large supporting force can be provided to the lower jig plate 46 by the columnar member 50a so that the lower jig plate 46 bends less, and the amount of bending of the lower jig plate 46 can be adjusted to be small amount in accordance with the strain amount of columnar member 50a. That is, That is, if no measures are taken, the center area of the lower jig plate 46 is bent in a concave shape, but in the present embodiment, bending becomes relatively small as shown in FIG. 3B. As a result, load applied to the lower jig plate 46 can be increased, and the amount of load applied to the substrate 2 arranged on the lower jig plate 46 can be increased.

Also, by supporting the lower jig plate 46 with the columnar members 50b and 50c having relatively large strain amounts at position where the load applied to the lower jig plate 46 is relatively large, relatively small supporting force can be provided to the lower jig plate 46 by the columnar members 50b and 50c, so that the lower jig plate 46 bends easily, and bending of the lower jig plate 46 can be adjusted to large amount of bending in accordance with the amounts of strain of the columnar members 501) and 50c. That is, if no measures are taken, the outer peripheral area of the lower jig plate 46 is hardly bent, but in the present embodiment, bending becomes relatively large as shown in FIG. 3B. As a result, load applied to the lower jig plate 46 can be reduced, and the amount of load applied to the substrate 2 arranged on the lower jig plate 46 can be reduced.

Figure 5A:
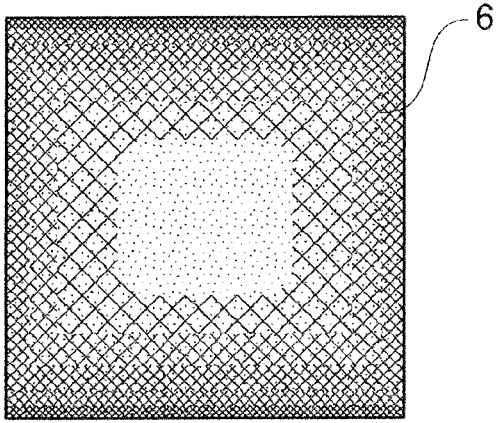
FIG. 5A is a diagram showing an in-plane distribution of load applied to a pressure sensitive paper when the lower jig plate is not supported by columnar members.
Figure 5B:
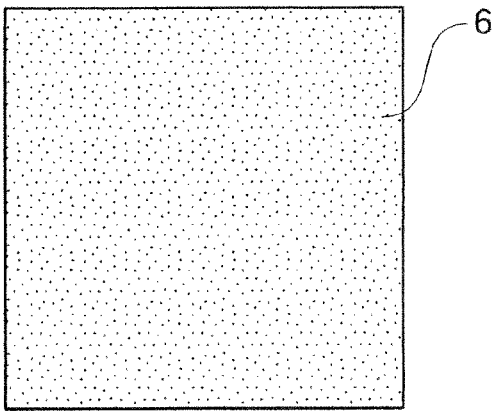
FIG. 5B is a diagram showing an in-plane distribution of load applied to the pressure sensitive paper when the lower jig plate is supported by the columnar members.

FIG. 5A is a diagram showing a distribution of load applied to the pressure sensitive paper 6 arranged on the lower jig plate 46 when the lower jig plate 46 (FIG. 3A) is mounted on a flat plate-shaped member (a member corresponding to the upper mounting portion 43) without using the support member 45 of the present embodiment (that is, FIG. 5A shows a comparative example). Also, FIG. 5B is a diagram showing a distribution of load applied to the pressure sensitive paper 6 arranged on the lower jig plate 46 when the lower jig plate 46 is supported by the support member 45 of the present embodiment (that is, FIG. 5B shows an example). In FIGS. 5A and 5B, the distribution of load applied to the pressure sensitive paper 6 matches the distribution of load applied to the substrate 2. In these figures, a portion with a darker color indicates that a relatively large load is applied, and a portion with a lighter color indicates that a relatively small load is applied.

As shown in FIG. 5A, in a comparative example, the closer it is to the center area of the pressure sensitive paper 6, load applied to the pressure sensitive paper 6 decreases in relativity; on the other hand, the closer it is to the outer peripheral area of the pressure sensitive paper 6, load applied to the pressure sensitive paper 6 increases in relativity. That is, in a comparative example, a relatively large bending is generated around the centrer area of the lower jig plate 46, while a relatively small bending is generated around the outer periphery of the lower jig plate 46.

On the contrary, as shown in FIG. 5B, in an example, load is uniformly applied to the pressure sensitive paper 6 at each position of the pressure sensitive paper 6. In the present embodiment, as shown in FIG. 3B, by bending the lower jig plate 46 so that load applied to each position of the lower jig plate 46 is balanced out, the in-plane distribution of load applied to the lower jig plate 46 can be adjusted to be uniform as shown in FIG. 5B, and uniform load can be applied to the substrate 2 arranged on the lower jig plate 46.

The example shown in FIG. 4 shows an embodiment in which the in-plane distribution of the load applied to the lower jig plate 46 is adjusted based on the difference of the strain amounts of the columnar members 50*a*, 50*b*, and 50*c* having different cross-sectional areas, however the embodiment for carrying out such adjustment is not limited thereto.

Figure 6A:
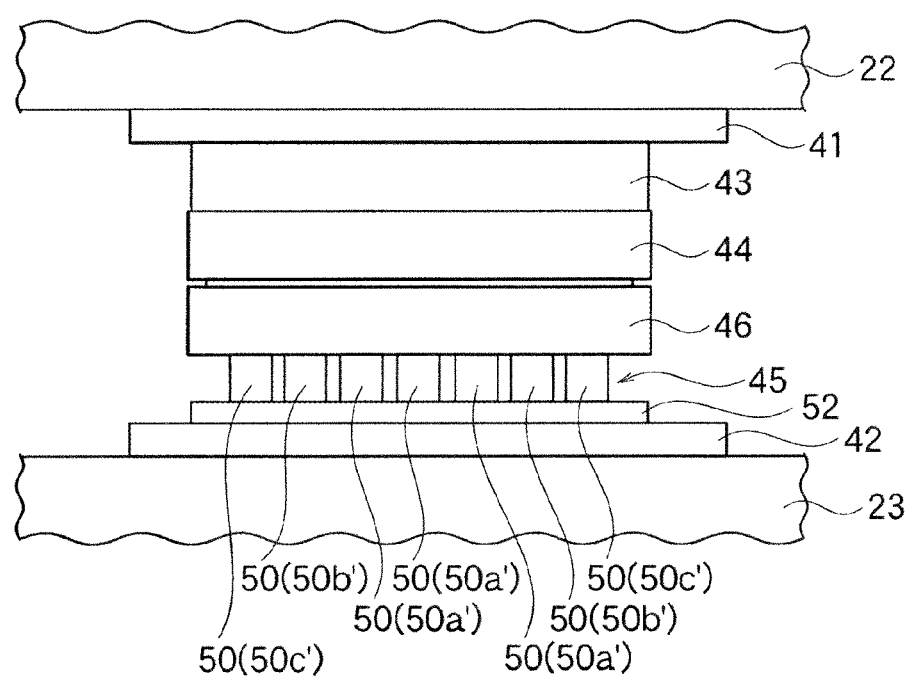
FIG. 6A is an enlarged side view showing a modification example of the support member shown in FIG. 3A.
Figure 6A:
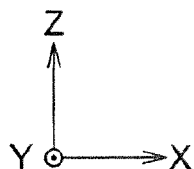

For example, the support member 45 may adjust the in-plane distribution of load applied to the lower jig plate 46 by differences in the strain amounts based on the Young's moduli of the columnar members 50 when a certain load is applied. In the example shown in FIG. 6A, the columnar members 50*a*', 50*b*', and 50*c*' are made of members having different Young's moduli (mechanical strengths) or different harness.

More specifically, the columnar member 50*a*' having a relatively large Young's modulus is arranged near the center area of the lower jig plate 46 where load applied to the lower jig plate 46 is relatively small. Also, the columnar member 50*c*' having a relatively small Young's modulus is arranged near the outer peripheral area of the lower jig plate 46 where load applied to the lower jig plate 46 is relatively large. Also, the columnar member 50*b*' having a relatively moderate Young's modulus is arranged at a position between the center area and the outer peripheral area of the lower jig plate 46 where load applied to the lower jig plate 46 is relatively moderate. That is, the Young's moduli of each of the columnar members 50*a*', 50*b*', and 50*c*' is in accordance with the in-plane distribution of load applied to lower jig plate 46, and the Young's moduli of the columnar members 50 have a gradient in which the Young's moduli become smaller at a position farther away from the center area of the lower jig plate 46. Note that, the cross-sectional areas and shapes of the columnar members 50*a*', 50*b*', and 50*c*' are all the same.

In this case, when the lower jig plate 46 is supported by the plurality of columnar members 50*a*', 50*b*', and 50*c*', load is applied to the lower jig plate 46 by applying pressure to the substrate 2 using the upper jig plate 44. Along with that, load is applied to the columnar members 50*a*', 50*b*', and 50*c*', then the columnar members 50*a*', 50*b*', and 50*c*' are strained in accordance with the Young's moduli of the columnar members 50*a*', 50*b*', and 50*c*', and the lower jig plate 46 bends by the amount of bending in accordance with the stain amounts of the columnar members 50*a*', 50*b*', and 50*c*'.

That is, since a relatively small strain is generated to the columnar member 50*a*', a relatively small bending is generated to the center area of the lower jig plate 46. Also, since a relatively large strain is generated to the columnar member 50*c*', a relatively large bending is generated to the outer peripheral area of the lower jig plate 46. Also, since a relatively moderate strain is generated to the columnar member 50*b*', a relatively moderate bending is generated at a position between the center area and the outer peripheral area of the lower jig plate 46.

As described above, the columnar members 50*a*', 50*b*', and 50*c*' are strained in accordance with the in-plane distribution of load applied to the lower jig plate 46, and the lower jig plate 46 bends in accordance with the strain amounts of the columnar members 50*a*', 50*b*', and 50*c*', thereby the lower jig plate 46 can bend so that load applied to each position of the lower jig plate 46 is balanced out (see FIG. 3B), and uniform load can be applied to the substrate 2.

The Young's moduli E of the columnar members 50 may preferably be within a range of 100 GPa to 500 GPa. Also, a ratio Emax/Emin may preferably be within a range of 2/1 to 4/1 in which Emax represents the Young's modulus E of the columnar member 50*a*' having the largest Young's modulus and Emin represents the Young's modulus E of the columnar member 50*c*' having the smallest Young's modulus. By setting the range of the Young's moduli of each of the columnar members 50*a*', 50*b*', and 50*c*' within such range, the columnar members 50*a*', 50*b*', and 50*c*' can be bent appropriately in accordance with the in-plane distribution of the load applied to the lower jig plate 46. Note that, the support member 45 may include another columnar member 50 having a Young's modulus different from that of the columnar members 50*a*', 50*b*', and 50*c*'.

As a material having the Young's modulus described in above, the columnar members 50 are preferably made of a material such as carbon steel, silicon nitride, or silicon carbide.

Also, for example, the support member 45 may adjust the in-plane distribution of load applied to the lower jig plate 46 by differences in lengths of the columnar members 50. In the example shown in FIG. 6B, columnar members 50*a*" 50*b*", and 50*c*" are formed of members having different lengths, and a height distribution is formed at a height position of an upper end of the columnar members 50*a*", 50*b*", and 50*c*".

More specifically, the columnar member 50*a*" having a relatively long length is arranged closer to the center area of the lower jig plate 46 where the load applied to the lower jig plate 46 is relatively small. Also, the columnar member 50*c*" having a relatively short length is arranged around the outer peripheral area of the lower jig plate 46 where the load applied to the lower jig plate 46 is relatively large. Also, a columnar member 50*b*" having a relatively moderate length is arranged at a position between the center area and the outer peripheral area of the lower jig plate 46 where the load applied to the lower jig plate 46 is relatively moderate. That is, the length of each of the columnar members 50*a*", 50*b*", and 50*c*" has a value which matches the in-plane distribution of the load applied to the lower jig plate 46, and the lengths of the columnar members 50 (the height position of the upper end) are arranged so that a height gradient is formed which becomes shorter as it is further away from the center area of the lower jig plate 46. Note that, the cross-sectional areas and Young's moduli of the columnar members 50*a*", 50*b*", and 50*c*" are all the same.

In this case, when the lower jig plate 46 is supported by the columnar members 50*a*", 50*b*", and 50*c*", load is applied to the lower jig plate 46 by applying pressure to the substrate 2 using the upper jig plate 44. Along with that, load is applied to the columnar members 50*a*", 50*b*", and 50*c*", and the lower jig plate 46 bends in accordance with the lengths of the columnar members 50*a*", 50*b*", and 50*c*".

That is, relatively small bending is generated to the area close to the center of the lower jig plate 46 where the columnar member 50*a*" is arranged. Also, a relatively large bending is generated to the outer peripheral area of the lower jig plate 46 where the columnar member 50*c*" is arranged. Also, a relatively moderate bending is generated at a position between the center area and the outer peripheral area of the lower jig plate 46 where the columnar member 50*b*" is arranged. As such, the columnar members 50*a*", and 50*c*" having different lengths are arranged in accordance with the in-plane distribution of load applied to the lower jig plate 46, and the lower jig plate 46 is bent by the amount of bending in accordance with the lengths of the columnar members 50*a*", 50*b*", and 50*c*", thereby the lower jig plate 46 bends in a way that the load applied to each position of the lower jig plate 46 is balanced out (see FIG. 3B), and a uniform load can be applied to the substrate 2. Note that, the support member 45 may include other columnar members 50 having a length different from that of the columnar members 50*a*", 50*b*", and 50*c*".

Note that, bending of the lower jig plate 46 can be done more easily and more accurately by adjusting the material (Young's modulus) or the diameter (cross-sectional area) of the columnar members 50 than by adjusting the height of the columnar members 50.

The arrangement of the columnar members 50 is not limited to the example shown in FIG. 4, and for example, the columnar members 50 may be arranged as shown in FIGS. 7A, 8A, 9A, and 10A. In the example shown in FIG. 7A, nine columnar members 50*d* are arranged in a matrix form of 3 rows and 3 columns in a center area 520 of the installation portion 52 which is indicated by a dotted line. Also, columnar members 50*c* are locally arranged at outside the center area 520 of the installation portion 52. The columnar members 50*d* and 50*e* are arranged so as to extend radially from the center of the installation portion 52. The columnar members 50*d* are arranged in a relatively high density at the center area 520 of the installation portion 52, and the columnar members 50*c* are arranged in a relatively low density at outside of the center area 520 of the installation portion 52.

Figure 7A:
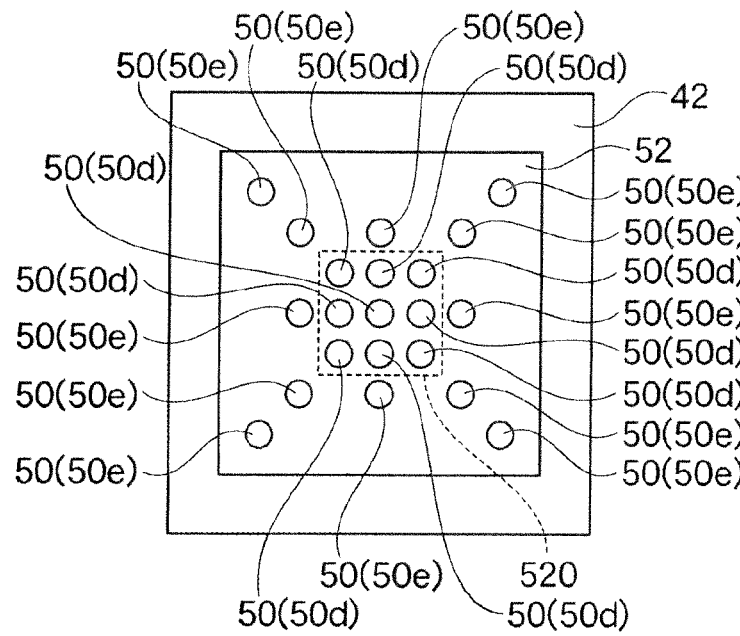
FIG. 7A is a diagram showing another arrangement example of the columnar members.

That is, in the example shown in FIG. 7A, at a position (central region 520) where load applied to the lower jig plate 46 (FIG. 1B) is relatively small, a relatively more columnar members 50*d* are densely arranged than at a position (outside of the center area 520) where the load applied to the lower jig plate 46 is relatively large.

Figure 7B:
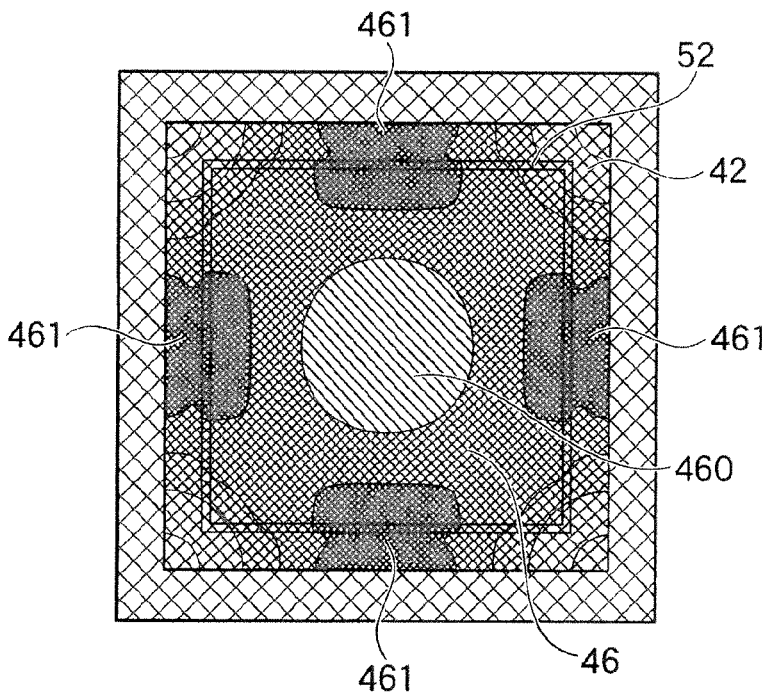
FIG. 7B is a diagram showing an in-plane distribution of load applied to the substrate or the lower, jig plate when the columnar members are arranged in an arrangement shown in FIG. 7A.

FIG. 7B shows a result of analyzing a distribution of bending generated to the lower jig plate 46 using CAE (Computer Aided Engineering) analysis when the lower jig plate 46 is supported by the columnar members 50*d* and 50*e* shown in FIG. 7A. In these figures, a portion with a darker color indicates a relatively large bending, and a portion with a lighter color indicates that a relatively small deflection.

As shown in FIG. 7B, since the center area 460 of the lower jig plate 46 which matches the center area 520 of the installation portion 52 is supported by a relatively more columnar members 50*d*, at the center area 460, a relatively large supporting force is provided to the lower jig plate 46 by the columnar members 50*d*, thus the lower jig plate 46 bends less. That is, in the center area 460, bending generated to the lower jig plate 46 is adjusted to a small bending amount in accordance with the density (number) of the columnar members 50*d*, and a relatively small bending is generated to the center area 460. As a result, the load applied to the lower jig plate 46 increases.

On the other hand, since the area outside the center area 460 of the lower jig plate 46 is supported by a relatively fewer columnar members 50*c*, in this area, a relatively small supporting force is provided to the lower jig plate 46 by the columnar members 50*c*, thus the lower jig plate 46 tends to bend easily. That is, in the area outside the center area 460, bending generated to the lower jig plate 46 is adjusted to a large bending amount in accordance with the density (number) of the columnar members 50*c*, and a relatively large bending is generated to the area. As a result, the load applied to the lower jig plate 46 decreases.

In particular, in the side area 461 of the lower jig plate 46 which is not supported by the columnar member 50*c*, the lower jig plate 46 particularly easily bends, and the amount of bending of the lower jig plate 46 is particularly large compared to other areas.

As such, by arranging the columnar members 50*d* and 50*e* in accordance with the in-plane distribution of load applied to the lower jig plate 46, bending of the lower jig plate 46 is adjusted in accordance with the arrangement of the columnar members 50*d* and 50*e* so that load applied to each position of the lower jig plate 46 is balanced out, and a uniform load can be applied to the substrate 2 arranged on the lower jig plate 46.

Figure 8A:
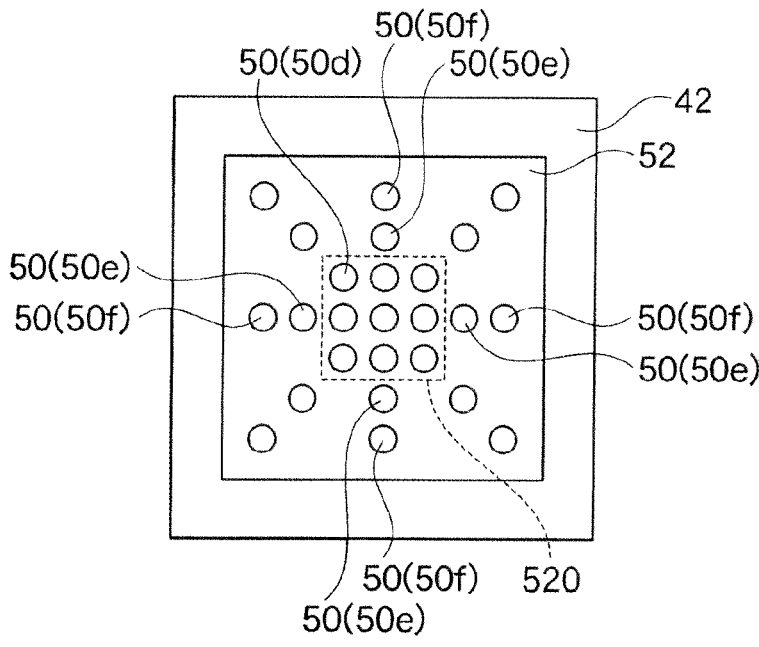
FIG. 8A is a diagram showing another arrangement example of the columnar members.

In the example shown in FIG. 8A, in addition to the columnar members 50*d* and 50*e* shown in FIG. 7A, columnar members 50*f* (four of them) are arranged on the installation portion 52. Each of the additionally arranged columnar members 50*f* is arranged adjacent to the outside of the four columnar members 50*c* arranged outside of the center area 520.

Figure 8B:
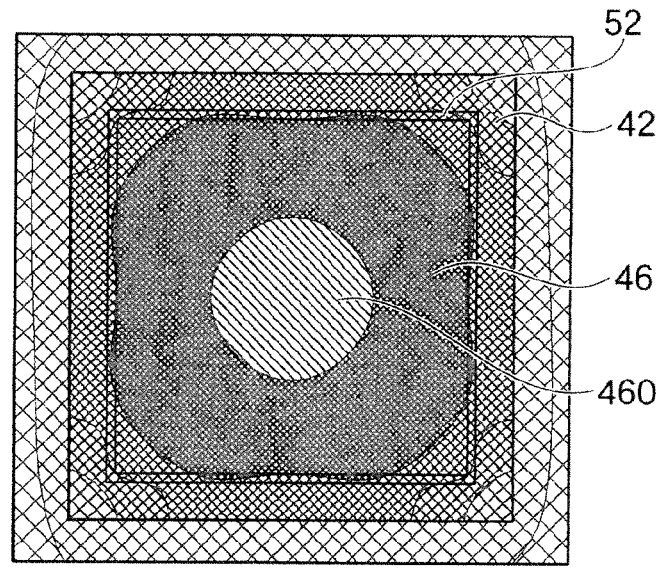
FIG. 8B is a diagram showing an in-plane distribution of load applied to the substrate or the lower jig plate when the columnar members are arranged in an arrangement shown in FIG. 8A.

Also in this case, as shown in FIG. 8B, relatively small bending is generated to the center area 460 of the lower jig plate 46, while relatively large bending is generated to outside the center area 460, which is as similar to FIG. 8A. The lower jig plate 46 shown in FIG. 8B bends across a wider area at outside of the center area 460 compared to the lower jig plate 46 shown in FIG. 7B.

Figure 9A:
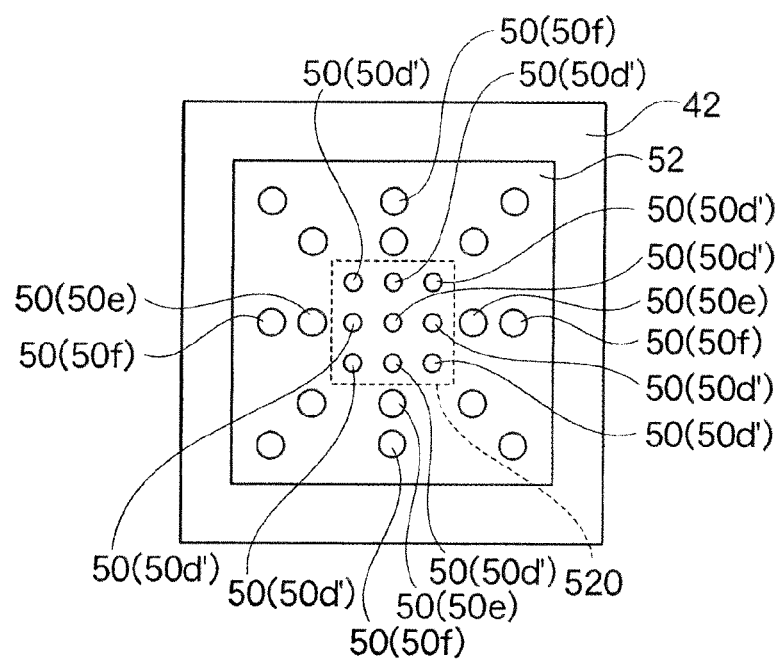
FIG. 9A is a diagram showing another arrangement example of the columnar members.

In the example shown in FIG. 9A, the columnar members 50*d'*, 50*c*, and 50*f* are arranged on the installation portion 52 in the same arrangement as shown in FIG. 8A. Note that, the diameters of the columnar members 50*d'* arranged on the center area 520 of the installation portion 52 are smaller than the diameters of the columnar members 50*c* and 50*f* arranged on outside the center area 520.

Figure 9B:
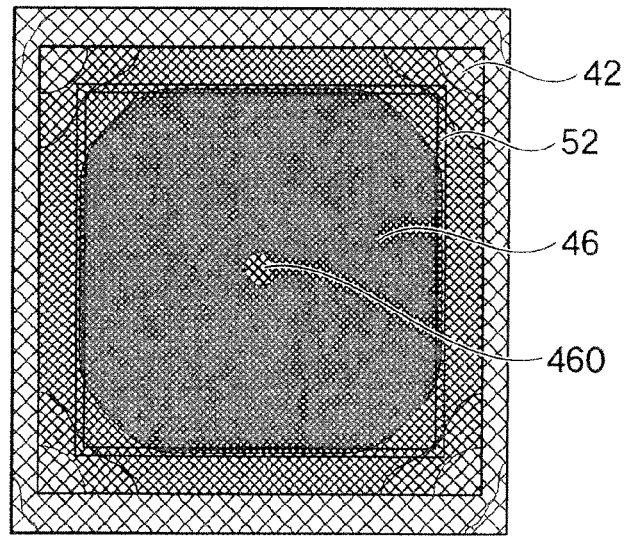
FIG. 9B is a diagram showing an in-plane distribution of load applied to the substrate or the lower jig plate when the columnar members are arranged in an arrangement shown in FIG. 9A.

In this case, compared to the example shown in FIG. 8A, the supporting force provided to the center area 460 of the lower jig plate 46 by the columnar members 50*d'* decreases, thus, as shown in FIG. 9B, the center area 460 of the lower jig plate 46 bends more compared to the lower jig plate 46 shown in FIG. 8B.

Figure 10A:
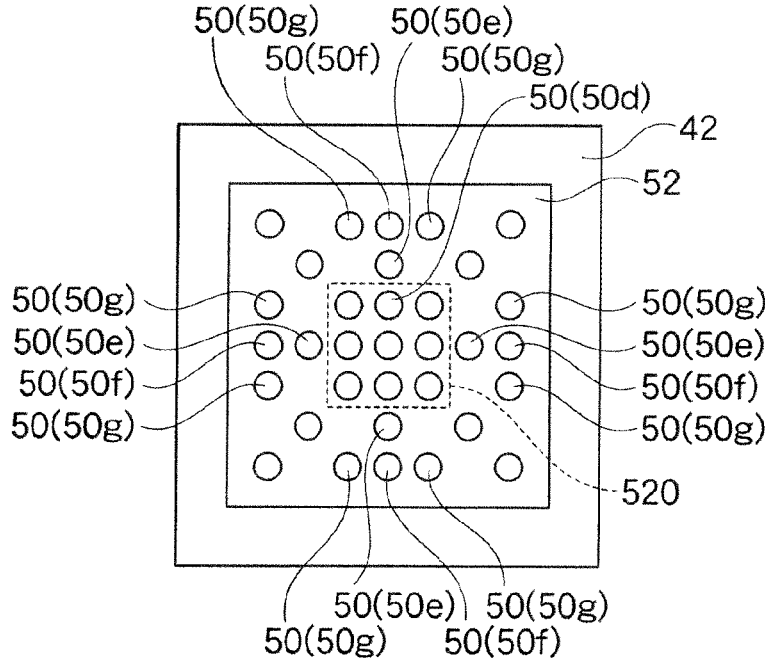
FIG. 10A is a diagram showing another arrangement example of the columnar members.

In the example shown in FIG. 10A, in addition to the columnar members 50*d*, 50*e*, and 50*f* shown in FIG. 8A, columnar members 502 (eight of them) are arranged on the installation portion 52. Each of the additionally arranged columnar members 50*g* is arranged adjacent to the four columnar members 50*f* arranged outside the center area 520.

In this case, a relatively large bending is generated to the center area 460 of the lower jig plate 46, while a relatively small bending is generated to outside of the center area 460. As such, when the columnar members 50*g* are additionally arranged on the installation portion 52, the in-plane distribution of load applied to the lower jig plate 46 is adjusted to have an in-plane distribution opposite of the in-plane distribution of load shown in FIGS. 7B, 8B, and 9B.

Depending on the in-plane distribution of load applied to the lower jig plate 46, the columnar members 50 are appropriately installed to the installation portion 52 using at least one arrangement shown in FIGS. 4, 7A, 8A, 9A, and 10A. Note that, the columnar members 50 may be installed to the installation portion 52 in an arrangement other than the arrangements shown in FIGS. 4, 7A, 8A, 9A, and 10A.

Also, as described above, when the lower jig plate 46 is not supported by the support member 45, there is a problem, that is, the closer it is to the center area of the lower jig plate 46, the larger the bending of the lower jig plate 46 becomes, and the closer it is to the outer periphery of the lower jig plate 46, the smaller the bending of the lower jig plate 46 becomes. The above-mentioned embodiments have solved such problem. When the lower jig plate 46 is not supported by the support member 45, there may be a case that the closer it is to the center area of the lower jig plate 46, the smaller the bending becomes, and the closer it is to the outer peripheral area of the lower jig plate 46, the larger the bending is relatively. In this case, the in-plane distribution of load applied to the lower jig plate 46 is roughly the opposite of the in-plane distribution of load shown in FIG. 5A, and load applied to the center area of the lower jig plate 46 becomes relatively large, while load applied to the outer peripheral area of the lower jig plate 46 becomes relatively small.

In such case, the material (Young's modulus), shape, arrangement, and so on of the columnar members 50 arranged on the installation portion 52 may be selected appropriately so that the columnar member 50 arranged closer to the center area of the lower jig plate 46 has a larger strain and the columnar member 50 arranged closer to the outer peripheral area of the lower jig plate 46 has a smaller strain. For example, for the columnar members 50 arranged closer to the center area of the lower jig plate 46, those with smaller Young's modulus or smaller diameter may be used; and for the columnar members 50 arranged closer to the outer peripheral area of the lower jig plate 46, those with larger Young's modulus or larger diameter may be used.

When the lower jig plate 46 is supported by the columnar members 50 having such strain characteristics, the lower jig plate 46 bends easily at a position closer to the center area, and load applied to the lower jig plate 46 can be reduced. As a result, the load applied to the substrate 2 arranged on the lower jig plate 46 at said position can be also reduced.

Also, at a position closer to the outer periphery of the lower jig plate 46, the lower jig plate 46 bends less, and load applied to the lower jig plate 46 can be increased. As a result, load applied to the substrate 2 arranged on the lower jig plate 46 at said position can be increased.

Figure 11:
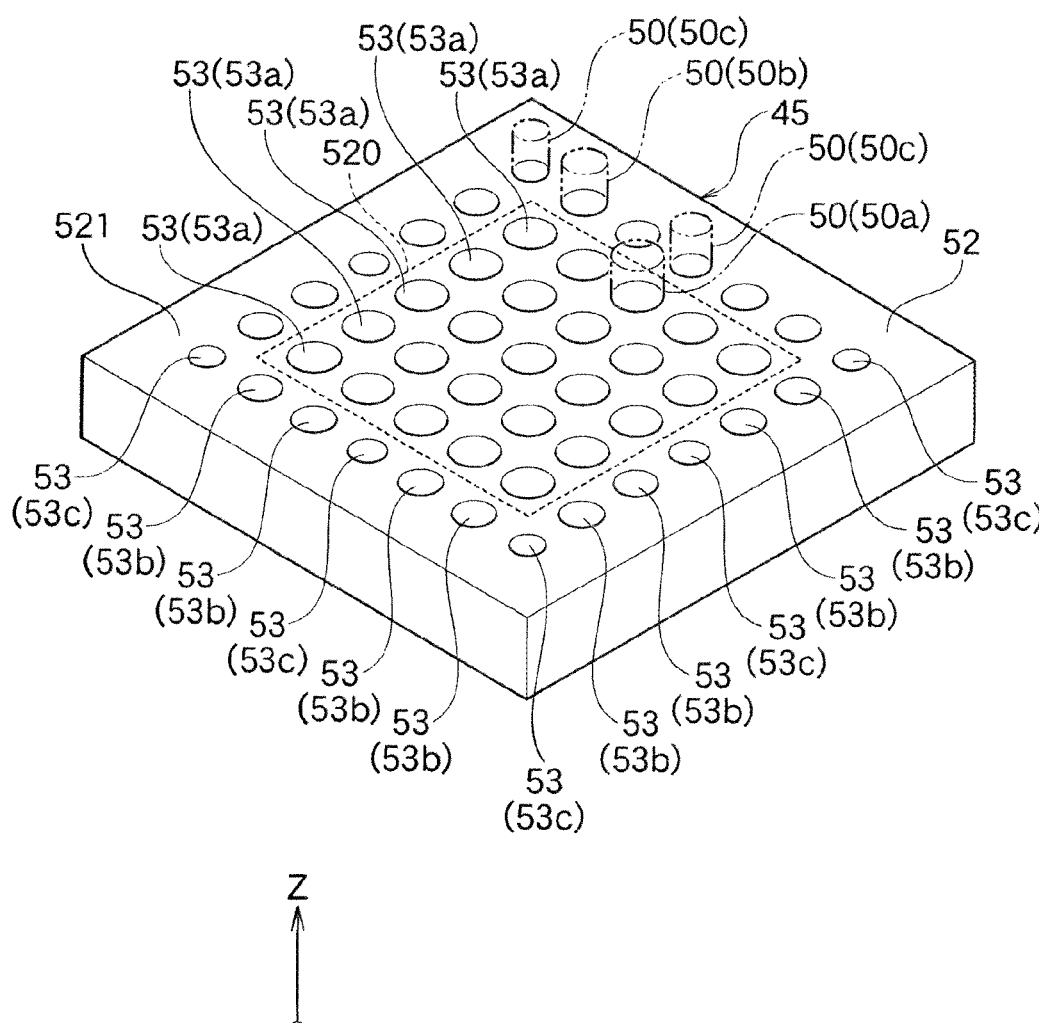
FIG. 11 is a perspective diagram showing a detailed configuration of the installation portion of FIG. 3A.

As shown in FIG. 11, the installation portion 52 is a board of roughly a flat-plate shape, and functions to support the columnar members 50 so that the columnar members 50 can stand upright. The installation portion 52 has installation holes 53 where the columnar members 50 are installed. The columnar members 50 are inserted in the installation holes 53, and these can be fixed. A length of the installation portion 52 in X axis direction may preferably be within a range of 100 to 500 mm, a length of the installation portion 52 in Y axis direction may preferably be within a range of 100 to 500 mm, and a height of the installation portion 52 may preferably be within a range of 10 to 100 mm.

The installation portion 52 has a center area 520 and an outer area 521. At the installation holes 53 foil led to the center area 520, the columnar members 50a shown in FIG. 4 are inserted, and at the installation holes 53 formed in the outer area 521, the columnar members 50b and 50c are inserted. In below, the installation holes 53 where the columnar members 50a are inserted may be referred to as "installation holes 53a", the installation holes 53 where the columnar members 50b are inserted may be referred to as "installation holes 53b", and the installation holes 53 where the columnar members 50c are inserted may be referred to as "installation holes 53c".

The installation holes 53a are arranged in a matrix form of 5 rows and 5 columns, and the arrangements of the installation holes 53a match the arrangements of the columnar members 50a shown in FIG. 4. Also, the arrangements of the installation holes 53b match the arrangements of the columnar members 50b shown in FIG. 4, and the arrangements of the installation holes 53c match the arrangements of the columnar members 50c shown in FIG. 4. The pitch between the installation holes 53 match the pitch between the columnar members 50.

The widths (diameters) of the installation holes 53 are not all the same, and distribution of the widths (diameters) of the installation holes 53 matches the distribution of widths (diameters) of the columnar members 50 shown in FIG. 4. That is, the widths of the installation holes 53 in the center area 520 are large, and the widths of the installation holes 53 (53a) in the outer area 521 are small.

The width (diameter) of the installation hole 53 is roughly the same as or larger than the width (diameter) of the columnar member 50. In the case that the width of the installation hole 53 and the width of the columnar member 50 are roughly the same, the columnar member 50 can be firmly fixed without having position shifting when the columnar member 50 is inserted into the installation hole 53.

An opening shape of the installation hole 53 is determined based on the shape of the columnar member 50, and for example, when the columnar member 50 is a circular column shape or a circular cone shape, the opening shape of the installation hole 53 may preferably be a circle. Also, when the columnar member 50 is a square prism shape, the opening shape of the installation hole 53 may preferably be a square.

The number of installation holes 53 is determined based on the number of columnar members 50, and it may be the same as the number of columnar members 50, it may also be more than the number of columnar members, or a plurality of columnar members 50 may be installed into one installation hole 53. That is, the columnar members 50 does not necessarily have to be installed to all of the installation holes 53, and there may be a installation hole 53 where the columnar member 50 is not installed.

Figure 12A:
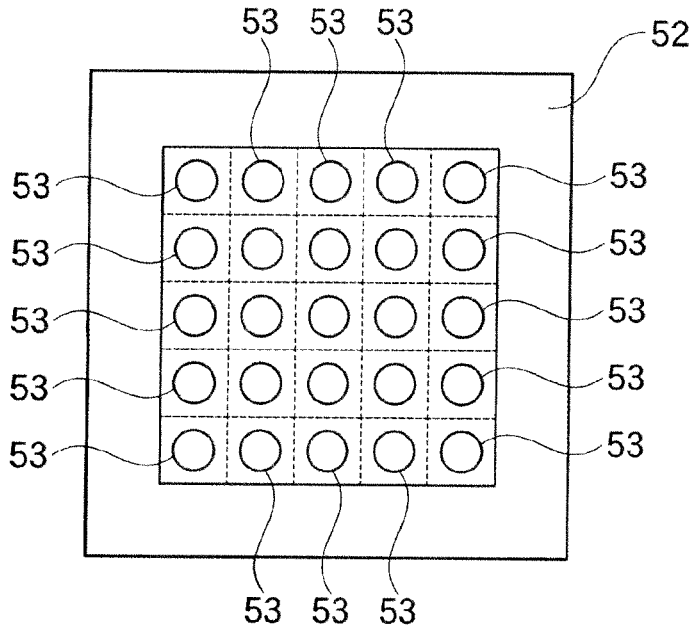
FIG. 12A is a plane diagram showing a modification example of the installation portion shown in FIG. 11.
Figure 12B:
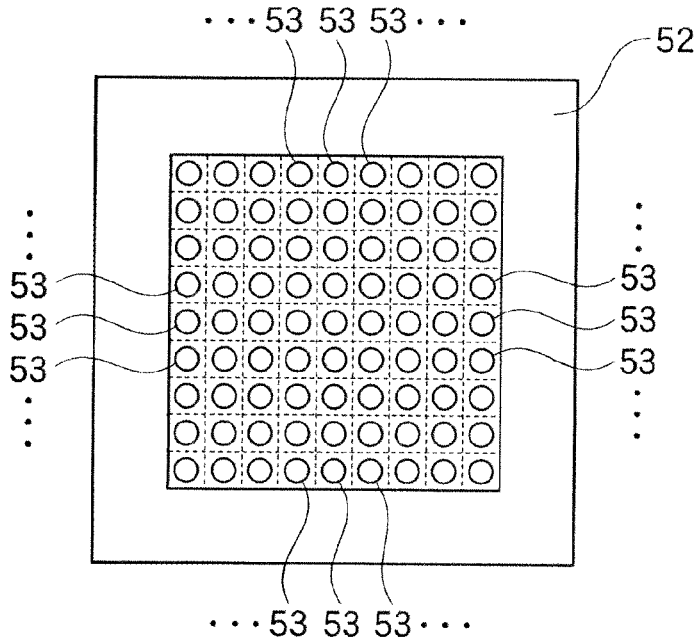
FIG. 12B is a plane diagram showing another modification example of the installation portion shown in FIG. 11.

Also, in the example shown in FIG. 11, the installation portion 52 has installation holes 53 arranged in a matrix form of 7 rows and 7 columns, but the installation holes 53 may be arranged in a matrix form of 5 rows and 5 columns as shown in FIG. 12A. Also, as shown in FIG. 1.2B, installation holes 53 with smaller diameters than the installation holes 53 of FIG. 12A may be arranged to the installation portion 52 in 9 rows and 9 columns.

Figure 12C:
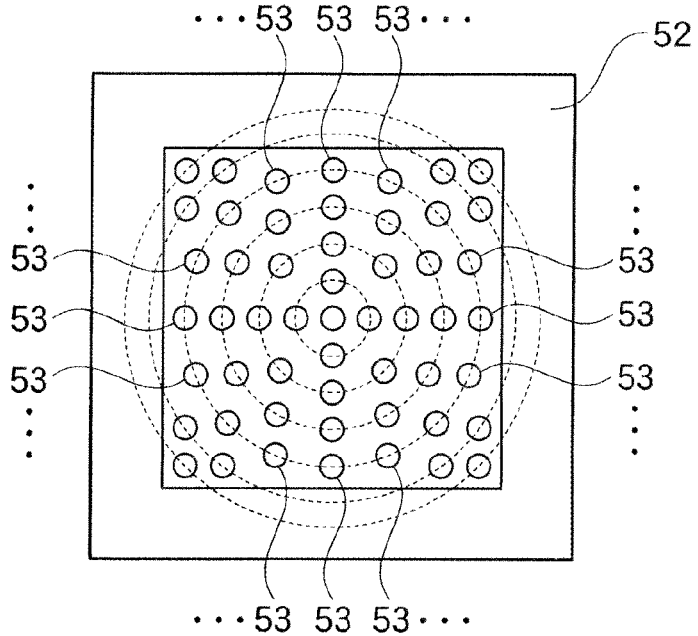
FIG. 12C is a plane diagram showing another modification example of the installation portion shown in FIG. 11.

Also, as shown in FIG. 12C, preferably the installation holes 53 may be arranged concentrically. In this case, when each columnar member 50 is arranged to each installation hole 53 to support the lower jig plate 46 (FIG. 1B), bending of the lower jig plate 46 can be adjusted appropriately in accordance with the in-plane distribution of load applied to the lower jig plate 46.

A ratio D/L which is a depth D of the installation hole 53 to a length L of the columnar member 50 may preferably be within a range of $1/10$ to $3/4$, more preferably within a range of $1/8$ to $1/2$. By having the ratio D/L within such range, when the columnar members 50 are installed in the installation holes 53, the columnar members 50 can be stably fixed in upright condition.

Figure 6B:
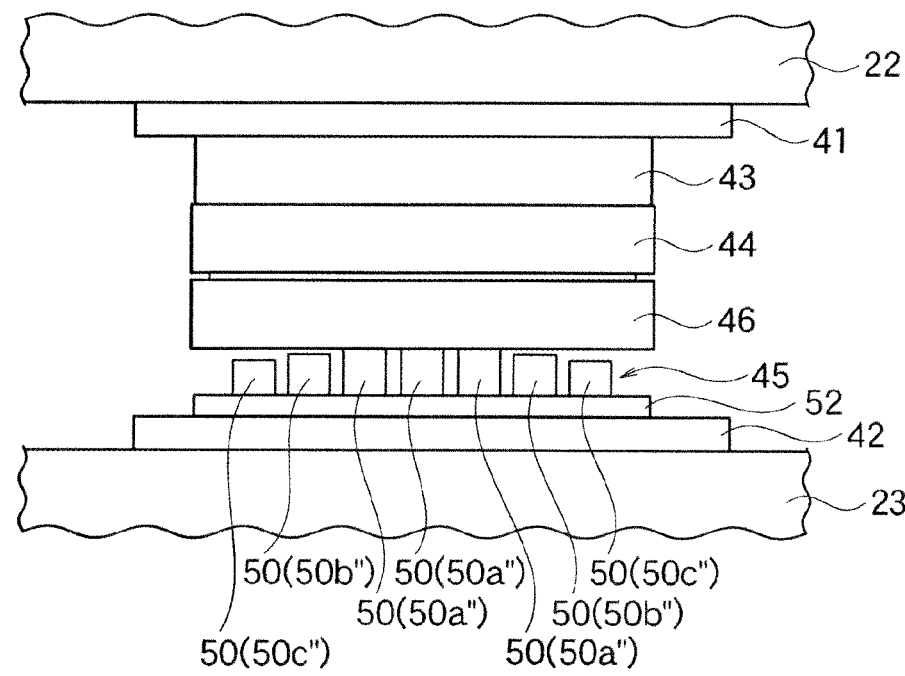
FIG. 6B is an enlarged side view showing another modification example of the support member shown in FIG. 3A.
Figure 6B:
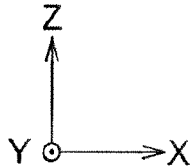

Note that, depths D of the installation holes 53 may be the same or different. For example, when the columnar members 50 with same lengths are installed to the installation holes 53 having different depths D, the height of the upper end positions of the columnar members 50 installed to the installation holes 53 with relatively deep depth D will be positioned lower than the height of the upper positions of the columnar members 50 installed to the installation holes 53 with relatively shallow depth D. Therefore, as shown in FIG. 6B, distribution of height can be formed at the height position of the upper ends of the columnar members 50.

The columnar members 50 may be joined (fixed) to the lower jig plate 46 using a joining member and the like. Alternatively, the columnar members 50 may not be joined (fixed) to the lower jig plate using the joining member and the like but the upper end faces of the columnar members 50 may simply be in contact with a lower face of the lower jig plate 46.

Figure 13A:
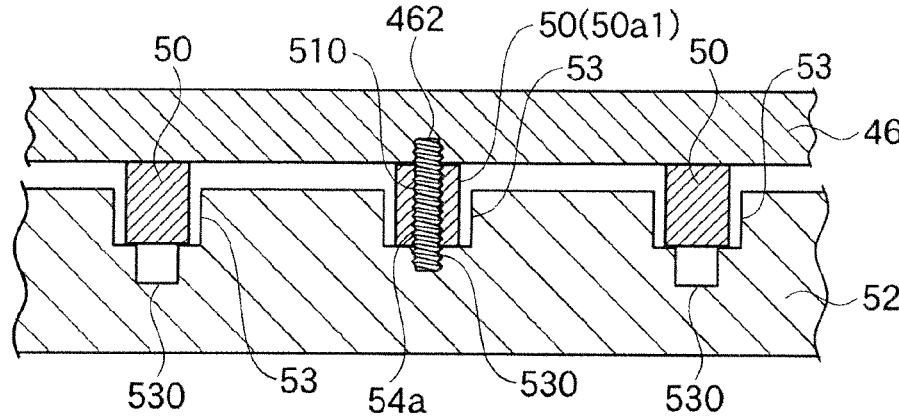
FIG. 13A is a diagram showing an embodiment of the columnar members being fixed to the installation portion and/or the lower jig plate.

As an embodiment where the columnar members 50 are joined to the lower jig plate 46 using the joining member and the like, for example, as shown in FIG. 13A, while the columnar members 50 are installed inside the installation holes 53, one of the columnar members 50 may be fixed to the lower jig plate 46 and the installation portion 52 (installation hole 53) using a penetrating type joining member 54a.

Particularly, regarding the columnar member 50 arranged under the pressurizing shaft for applying pressure to the substrate 2 (for example, the columnar member 50a1 positioned at the center among the columnar members 50 shown in FIG. 4), such columnar member 50 may preferably be joined to the lower jig plate 46 using the penetrating type joining member 54a. Note that, the pressurizing shaft for applying pressure to the substrate 2 corresponds to the pressurizing shaft of the apparatus configuring the load generating portion 30.

At the lower end of the pressurizing shaft, load applied to the lower jig plate 46 may become relatively small due to bending of the lower jig plate 46. By joining the columnar member 50a1 arranged at such position to the lower jig plate 46 using the penetrating type joining member 54a, bending of the lower jig plate 46 at such position can be effectively prevented.

By fixing only the columnar member 50a1 among the columnar members 50 to inside of the installation hole 53 using the penetrating type joining member 54a, bending of the lower jig plate 46 can be adjusted to be small at the center area of the lower jig plate 46, and load applied to the lower jig plate 46 can be made relatively large effectively.

The penetrating type joining member 54a may for example be a fastening tool such as a bolt, a rivet, and so on, or it may be any other joining members. The same applies to the non-penetrating type joining member 54b which is described in below. The penetrating type joining member 54a penetrates inside of a penetrating hole 510 formed to the columnar member 50 (50a1) and is screwed with the penetration hole 510. Note that, a screwing groove does not necessarily have to be formed to the penetrating hole 510, and the joining member may be inserted in the penetrating hole 510 and the joining member may be fixed to an inner wall face of the penetrating hole 510 using an adhesive member.

The lower end of the penetrating type joining member 54a is inserted inside a joining depression 530 formed to the installation hole 53, and screwed (engaged) to the joining depression 530. Also, the upper end of the penetrating type joining member 54a is inserted inside the joining depression 462 formed to the lower jig plate 46, and screwed (engaged) to the joining depression 462.

Thereby, the installation portion 52 and the columnar member 50 (50a1) and the lower jig plate 46 are physically joined using the penetrating type joining member 54a, and also the columnar member 50 (50a1) is firmly fixed (held) between the installation portion 52 and the lower jig plate 46. By joining the columnar member 50 (50a1) not only to the lower jig plate 46 but also to the installation portion 52, bending of the lower jig plate 46 can be prevented even more effectively at the position where the columnar member 50 (50a1) is arranged. Note that, diameters of the joining depression 530 and the joining depression 462 may be determined accordingly based on the diameter of the penetrating type joining member 54a (or the non-penetrating type joining member 54b).

Also, as an embodiment where the columnar members 50 are not joined to the lower jig plate 46 using the joining member and so on, as shown in FIG. 13A, the upper end faces of the columnar members 50 may contact the lower face of the lower jig plate 46 and the lower end faces of the columnar members 50 may simply be in contact with the lower faces of the installation holes 53. In this case, the columnar members 50 are installed to the installation portion 52 without being joined to neither of the lower jig plate 46 and the installation portion 52.

Figure 13B:
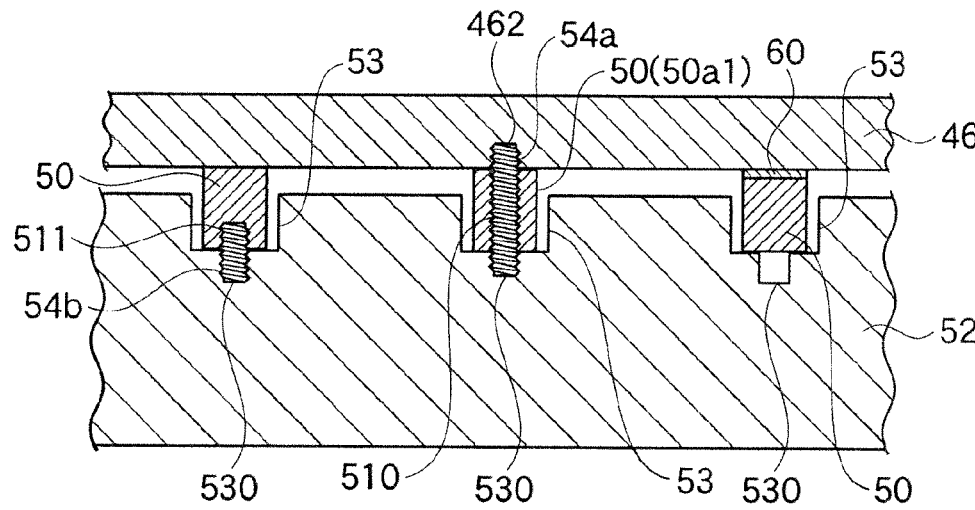
FIG. 13B is another diagram showing an embodiment of the columnar members being fixed to the installation portion and/or the lower jig plate.

Alternatively, as an embodiment where the columnar members 50 are not joined to the lower jig plate 46 using the joining member and so on, as shown in FIG. 13B, while the upper end faces of the columnar members 50 is in contact with the lower face of the lower jig plate 46 and the columnar members 50 are installed inside of the installation holes 53, one end (lower end) of the columnar members 50 may be joined to the lower face of the installation hole 53 using the non-penetrating joining member 54b.

One end of the non-penetrating joining member 54b is inserted inside the joining depression 530 formed to the installation hole 53, and screwed (engaged) with the joining depression 530. The other end of the non-penetrating type joining member 54b is inserted inside the joining depression 511 formed to the columnar member 50 and screwed (engaged) with the joining depression 511. Thereby, the columnar member 50 and the installation portion 52 are physically joined.

Figure 13C:
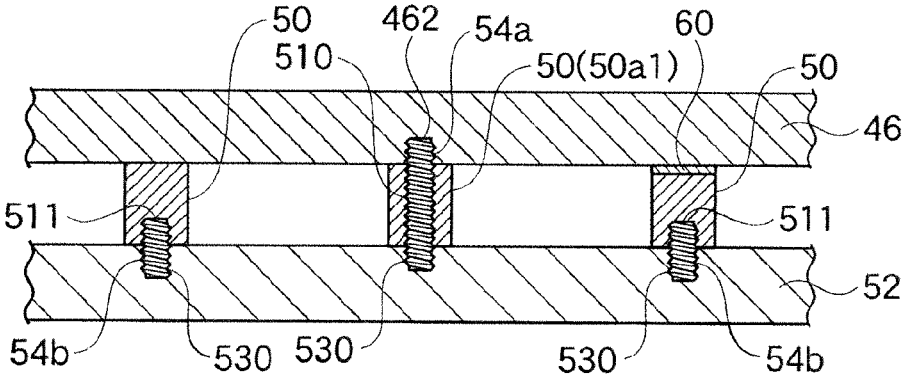
FIG. 13C is another diagram showing an embodiment of the columnar members being fixed to the installation portion and/or the lower jig plate.

Note that, as shown in FIG. 13C, the installation holes 53 may be omitted from the installation portion 52, and the joining depressions 530 may only be formed to the surface of the installation portion 52 formed roughly in a plane shape (roughly a flat shape). In this case, while the columnar members 50 are arranged between the installation portion 52 and the lower jig plate 46, the one end side of the non-penetrating type joining member 54b is inserted and screwed (engaged) to inside of the joining depressions 530. Also, the other end of the non-penetrating type joining member 54b is inserted and screwed (engaged) to inside of the joining depressions 511. Thereby, the columnar members 50 can be fixed to the installation portion 52 using the non-penetrating type joining member 54b.

Also, while the columnar members are arranged between the installation portion 52 and the lower jig plate 46, the lower end of the penetrating type joining member 54a is inserted and screwed (engaged) to inside of the joining depressions 530 and also inserted and screwed (engage) to the upper end of the penetrating type joining member 54a to inside of the joining depression 511. Thereby, the columnar members 50 can be fixed to the installation portion 52 and the lower jig plate 46 using the penetrating type joining member 54a.

Note that, the non-penetrating type joining member 54b shown in FIG. 13A to FIG. 13C joins the lower end of the columnar member 50 and the installation portion 52 (the lower face of the installation hole 53); however, the non-penetrating type joining member 54b may also join the upper end of the columnar member 50 and the lower jig plate 46. Also, in addition to joining of the lower end of the columnar member 50 and the installation portion 52 using the non-penetrating joining member, the upper end of the columnar member 50 and the lower jig plate 46 may be joined using the non-penetrating type joining member 54b.

Also, in all of the embodiments shown in FIG. 13A to FIG. 13C, the columnar members 50 may be fixed without using the non-penetrating type joining member 54b to the installation portion 52 but by using an adhesive member such as an adhesive and so on. Also, the columnar members 50 may be fixed to the installation portion 52 and the lower jig plate 46 using an adhesive member such as an adhesive and so on without using the penetrating type joining member 54a.

In FIG. 13A to FIG. 13C, at least one of the columnar members 50 which does not use the joining member and so on to be joined to the lower jig plate 46 may be provided to the lower jig plate 46 via the heat dissipation member 60. In this case, as shown in FIGS. 13B and 13C, the heat dissipation member 60 having a good heat dissipation property may be placed between the upper end face of the columnar member 50 and the lower face of the lower jig plate 46, or the outer surface of the columnar member 50 may be covered with the heat dissipating member. In the examples shown in the figures, the heat dissipating member 60 has a plate shape, however, it may be a cover capable of covering the columnar member 50.

By placing the heat dissipating member 60 between the upper end face of the columnar member 50 to the lower face of the lower jig plate, heat of the lower jig plate 46 can be efficiently transferred to the columnar member 50, and also said heat can be dissipated efficiently to outside through the columnar member 50. The heat dissipating member 60 is made of a member with high heat conductivity, and it may be aluminum, iron, silver, copper, or an alloy including at least one of these. Note that, some of the columnar members 50 provided with the heat dissipating member 60 may be made of a member with high heat conductivity.

The columnar members 50 shown in FIG. 3A can be installed to the installation holes 53 in accordance with the in-plane distribution of load applied to the lower jig plate 46. For example, as shown in FIG. 14A to FIG. 14H, the columnar members 50 may be installed to any installation hole 53 among the installation holes 53. In the figures, the black color part and the shaded line part indicate that the columnar member 50 is arranged in the installation hole 53. For example, in the example shown in FIG. 14A, the installation holes 53 are formed in a matrix form of 5 rows and 5 columns to the installation portion 52, five columnar members 50 are installed to the installation holes of the center area 520 of the installation portion 52, and four columnar members 50 are installed to the installation holes of the four corners of the installation portion 52. The columnar members 50 are not installed to other installation holes 53.

Figure 14A:
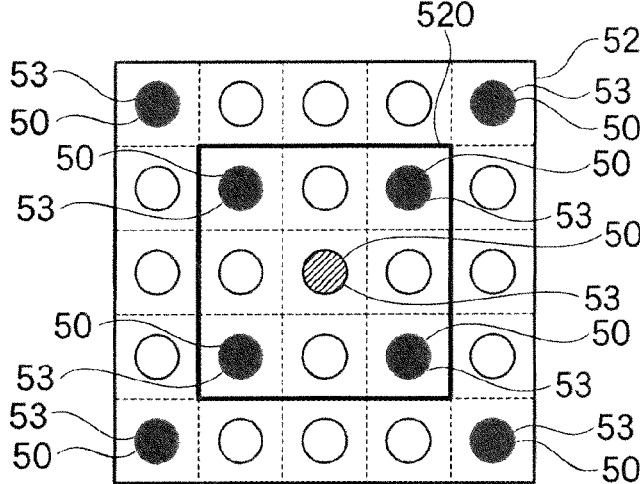
FIG. 14A is a diagram showing an embodiment of the columnar members being installed to the installation portion having the installation holes.

As shown in FIG. 14A, when relatively more columnar members 50 are arranged to the center area 520, the center area 460 of the lower jig plate 46 tends to bend less (see FIG. 7B), and larger load can be applied to the center area 460 of the lower jig plate 46.

More specifically, at the center area 520 where load applied to the lower jig plate 46 is relatively small, by installing the columnar members 50 to the installation holes 53 so that large supporting force can be provided to the lower jig plate 46 by the columnar members 50, the lower jig plate 46 bends less, and larger load can be applied to the lower jig plate 46. Also, at outside of the center area 520 where load applied to the lower jig plate 46 is relatively large, by reducing the number of installed columnar members 50 so as to provide small supporting force to the lower jig plate 46 by the columnar members 50, the lower jig plate bends easily and load applied to the lower jig plate 46 can be reduced. Thereby, bending of the lower jig plate 46 is adjusted so that load applied at each position of the lower jig plate 46 is balanced out, and uniform load can be applied to the substrate 2.

Note that, regarding the columnar member 50a1 arranged at the center of the center area 520, preferably it may be fixed to the installation portion 52 and the lower jig plate 46 using the penetrating type joining member 54a as shown in FIG. 13A. The same applies to FIG. 14B to FIG. 14H. Also, as long as the columnar member 50a1 has a structure Which can be fixed to the installation portion 52 and the lower jig plate 46, it is not necessarily limited to a bolt fixation shown in FIG. 13A to FIG. 13C. For example, a columnar member fixing member may be installed in a way which surrounds the columnar member 50a1, and the columnar member 50a1 may be fixed by clump fixing using said columnar member fixation member.

Thereby, by firmly fixing the columnar member 50a1 to the lower jig plate 46 by using the penetrating type joining member 54a, the lower jig plate 46 bends less at the position where the columnar member 50a1 is arranged, and load applied to the lower jig plate 46 can be effectively increased.

Also, the columnar members 50 other than the columnar member 50a1 are installed to the installation portion 52 but not joined to the lower jig plate 46 using the joining member and the like. Therefore, at the position where relatively large load is applied to the lower jig plate 46, the lower jig plate 46 tends to bend easily, and load applied to the lower jig plate 46 can be reduced effectively.

Figure 14B:
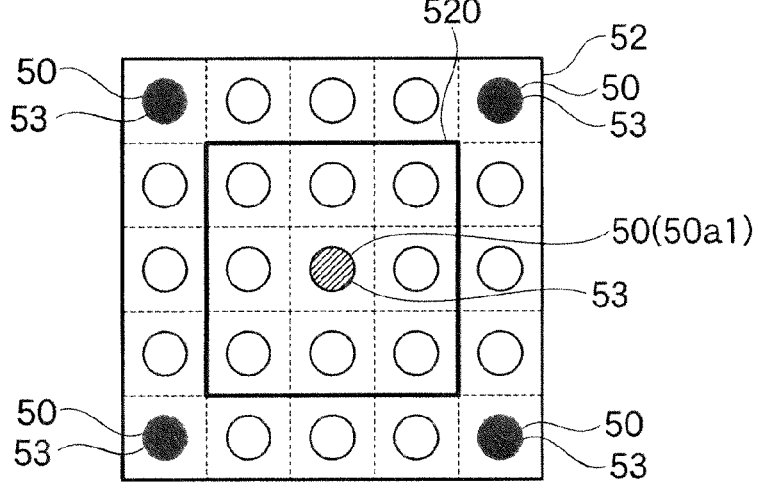
FIG. 14B is another diagram showing an embodiment of the columnar members being installed to the installation portion having the installation holes.

Also, in the example shown in FIG. 14B, one columnar member 50 (50a1) is installed to the center area 520 of the installation portion 52 and four columnar members 50 are installed to the four corners of the installation portion 52. No columnar member 50 is installed to other installation holes 53.

In this case, for example, the width (diameter) of the columnar member 50a1 arranged at the center area 520 is made relatively larger than the widths (diameters) of other columnar members 50, thereby the center area 460 of the lower jig plate 46 bends less (see FIG. 7B), and larger load can be applied to the lower jig plate 46.

Figure 14C:
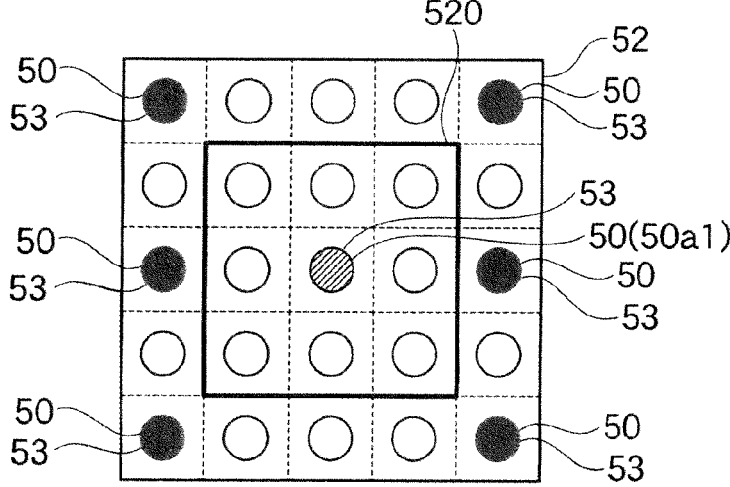
FIG. 14C is another diagram showing an embodiment of the columnar members being installed to the installation portion having the installation holes.

Also, in the example shown in FIG. 14C, to the arrangement shown in FIG. 14B, two additional columnar members 50 are arranged to the area outside of the center area 520. In this case, the area outside of the center area 460 of the lower jig plate 46 (see FIG. 7B) bends less, and larger load can be applied to the lower jig plate 46 of such area.

Figure 14D:
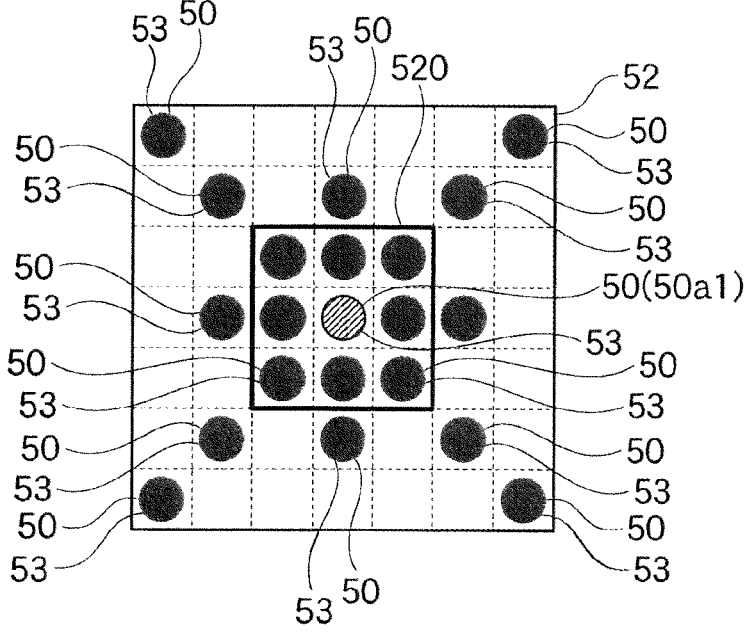
FIG. 14D is another diagram showing an embodiment of the columnar members being installed to the installation portion having the installation holes.

Also, in the example shown in FIG. 14D, nine columnar members 50 are arranged to the center area 520 of the installation portion 52, and twelve columnar members 50 are arranged to the area outside of the center area 520. The arrangement of the columnar members 50 shown in FIG.

14D is the same as the arrangement of the columnar members 50 shown in FIG. 7A, and the in-plane distribution of load applied to the lower jig plate 46 is adjusted to be the same as the in-plane distribution shown in FIG. 7B.

Figure 14E:
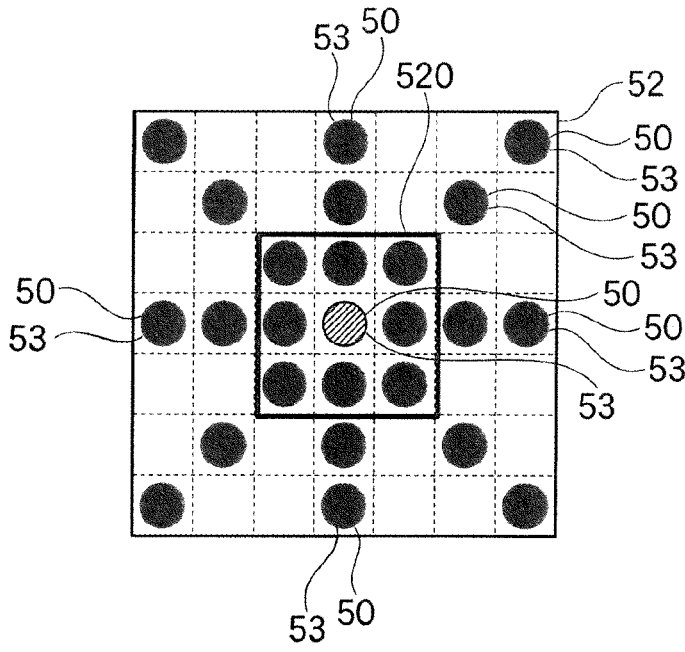
FIG. 14E is another diagram showing an embodiment of the columnar members being installed to the installation portion having the installation holes.

Also, in the example shown in FIG. 14E, to the arrangement shown in FIG. 14D, four additional columnar members 50 are arranged to the area outside of the center area 520. The arrangement shown in FIG. 14E is the same arrangement of the columnar members 50 shown in FIG. 8A, and the in-plane distribution of load applied to the lower jig plate 46 is adjusted to be the same as the in-plane distribution as shown in FIG. BB.

Figure 10B:
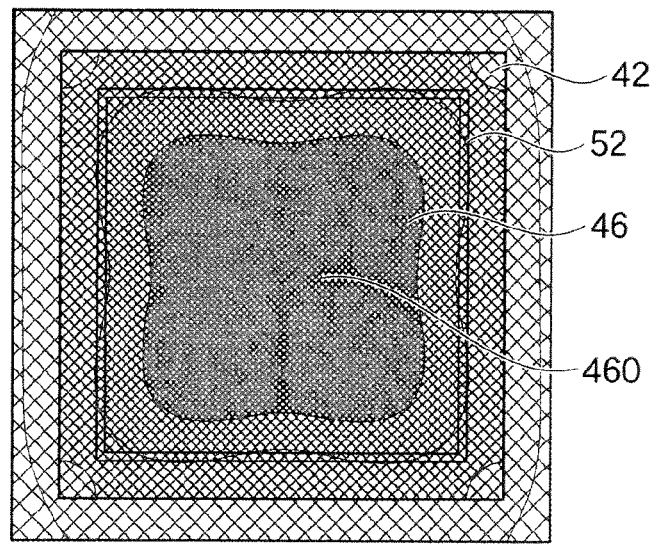
FIG. 10B is a diagram showing an in-plane distribution of load applied to the substrate or the lower jig plate when the columnar members are arranged in an arrangement shown in FIG. 10A.
Figure 14F:
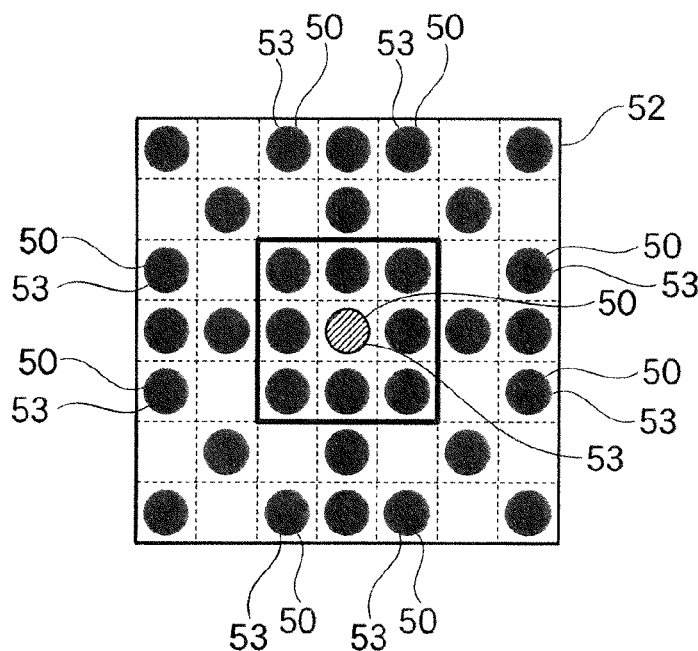
FIG. 14F is another diagram showing an embodiment of the columnar members being installed to the installation portion having the installation holes.

Also, in the example shown in FIG. 14F, to the arrangement shown in FIG. 14E, eight additional columnar members 50 are arranged to the area outside of the center area 520. The arrangement shown in FIG. 14F is the same arrangement of the columnar members 50 as shown in FIG. 10A, and the in-plane distribution of load applied to the lower jig plate 46 is adjusted to be the same in-plane distribution as shown in FIG. 10B.

Figure 14G:
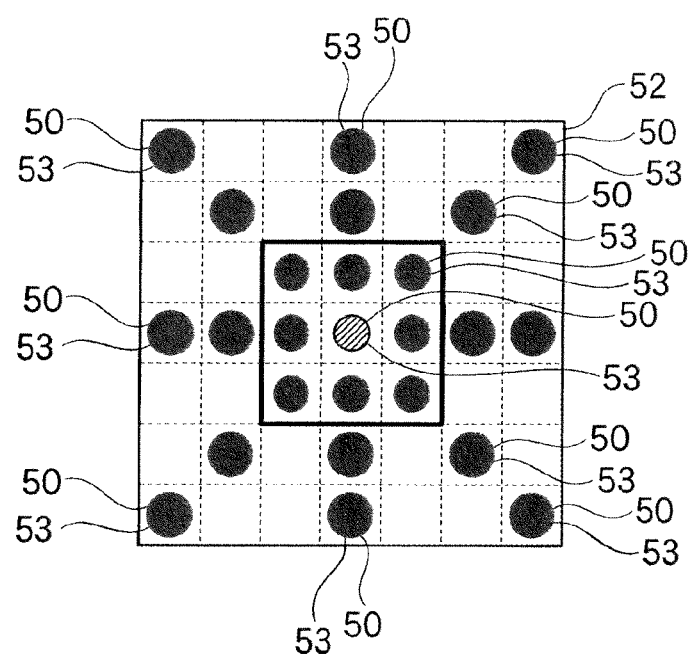
FIG. 14G is another diagram showing an embodiment of the columnar members being installed to the installation portion having the installation holes.

Also, in the example shown in FIG. 14G, the widths (diameters) of the five columnar members 50 arranged to the center area 520 of the installation portion 52 are smaller than the widths (diameters) of the columnar members 50 arranged to the outside of the center area 520. The arrangement shown in FIG. 14G is the same as arrangement of the columnar members 50 shown in FIG. 9A, and the in-plane distribution of load applied to the lower jig plate 46 is adjusted to be the same in-plane distribution as shown in FIG. 9B. As such, the diameters of the installation holes 53 may vary in accordance with the in-plane distribution of load applied to the lower jig plate 46.

Note that, on the contrary to the example shown in FIG. 14G, at the position where relatively small load is applied to the lower jig plate 46, the diameters of the installation holes 53 are made larger, and by installing the columnar members 50 with large diameters, large supporting force is provided to the lower jig plate 46 by the columnar members 50, and the lower jig plate 46 bends less, hence larger load can be applied to the lower jig plate 46. Also, at the position where relatively large load is applied to the lower jig plate 46, the diameters of the installation holes 53 is made smaller, and by installing the columnar members 50 with small diameters, the lower jig plate 46 bends easily, and load applied to the lower jig plate can be reduced. Thereby, bending of the lower jig plate 46 is adjusted so that load applied to each position of the lower jig plate 46 is balanced out, and thus uniform load can be applied to the substrate 2.

Figure 14H:
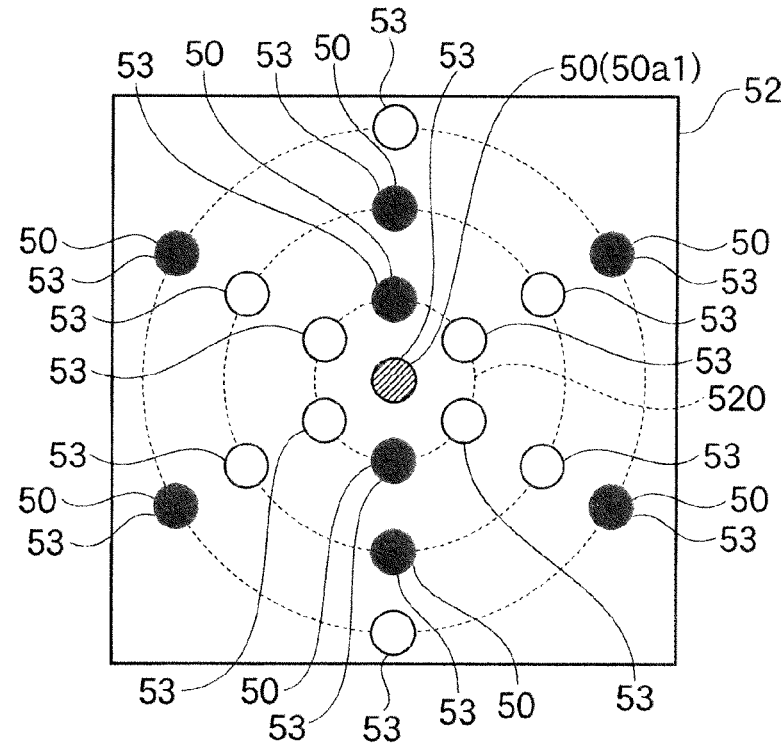
FIG. 14H is another diagram showing an embodiment of the columnar members being installed to the installation portion having the installation holes.

In the example shown in FIG. 14H, three columnar members 50 are arranged to the center area 520 of the installation portion 52, and six columnar members 50 are arranged to the area outside of the center area 520. The installation holes 53 are formed concentrically to the installation portion 52. The columnar members 50 are installed to the installation holes 53 arranged concentrically, and by arranging the columnar members 50 concentrically, bending of the lower jig plate 46 can be easily adjusted so that load applied to each position of the lower jig plate 46 is balanced out, and uniform load can be effectively applied to the substrate 2.

As discussed hereinabove, in the substrate processing apparatus 10 according to the present embodiment, the installation holes 53 are formed to the installation portion 52 so as to install the columnar members 50. By installing the columnar members 50 to the installation portion 52 (installation holes 53), the positions of the columnar members 50 can be determined easily, also position shifting of the columnar members 50 can be prevented, and the lower jig plate 46 can be stably supported by the columnar members 50. Therefore, the substrate processing apparatus 10 according to the present embodiment can effectively achieve uniform load applied to the substrate 2 by an easy means.

Also, just by installing each of the columnar members to the installation hole 53, the columnar members 50 can be placed to appropriate positions in accordance with the in-plane distribution of load applied to the lower jig plate 46.

Note that, the present disclosure is not limited to the above-described embodiments, and various modifications can be made within the scope of the present disclosure.

In the above embodiments, all of the columnar members 50 have a columnar shape. However, one of the columnar members 50 may be a columnar shape, and other columnar members may be a polygonal columnar shape, a conical shape, a polygonal pyramid shape, or the like. The columnar members 50 having such shapes have different strain amounts when a certain load is applied. Therefore, also in this case, similarly to the above embodiments, the support member 45 can adjust the in-plane distribution of load applied to the lower jig plate 46 and adjust bending generated to the lower jig plate 46 by difference in the stain amounts based on the difference in the shapes of the columnar members 50.

In the above embodiment, the support member 45 may provide a support force to the lower jig plate 46 in accordance with the distribution of height of the substrate 2 on which the elements 4a, 4b, and 4c are arranged. The non-uniformity of the load applied to the substrate 2 may be caused by the distribution of height of the substrate 2. The distribution of height of the substrate 2 may be caused by differences in shapes or sizes of the elements 4a, 4b, and 4c, by asymmetrical arrangement of the elements 4a, 4b, and 4c with respect to the substrate 2, by deformation of the elements 4a, 4b and 4c during pressurization, or the like. For example, if no measures are taken, a relatively small load may be applied at a position where the height of the substrate 2 is relatively low, and a relatively large load may be applied at a position where the height of the substrate 2 is relatively high (an opposite pattern may also occur).

Even in such a case, at a position where the height of the substrate 2 is relatively low, by arranging columnar members which does not strain easily, a relatively large supporting force is provided by the supporting member 45 (the columnar members 50) to the lower jig plate 46 so that load applied to the lower jig plate 46 increases; and at a position where the height of the substrate 2 is relatively high, by arranging columnar members 50 which easily strain, a relatively small supporting force is provided by the supporting member 45 (the columnar members 50) to the lower jig plate 46 so that load applied to the lower jig plate 46 decreases, thereby load applied to each position of the lower jig plate 46 can be balanced out, and uniform load can be applied to the substrate 2.

Figure 2:
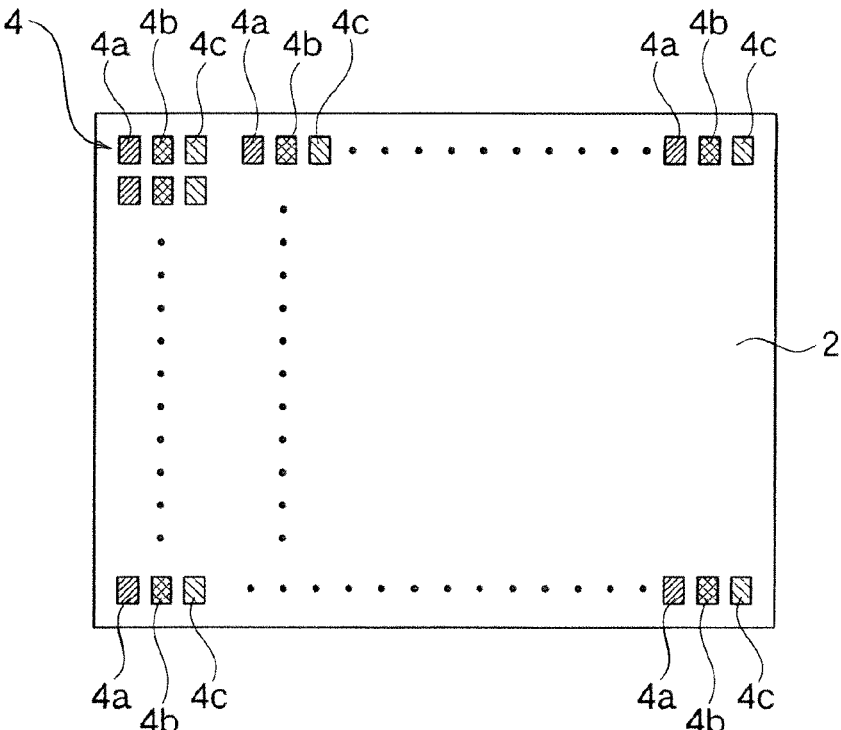
FIG. 2 is a diagram showing a substrate which is an object to be pressurized of the substrate processing apparatus shown in FIG. 1A.
Figure 2:
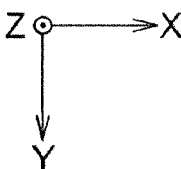

In the above embodiments, as shown in FIG. 2, the shape of the substrate 2 is a quadrangular shape, but it may be a circular shape or other polygonal shape.

In the above embodiments, the installation holes 53 may be formed on the installation portion 52 only to the positions where the columnar members 50 are arranged. Alternatively, the installation holes 53 may be formed on the installation portion 52 to the positions where the columnar members 50 are not arranged.

DESCRIPTION OF THE REFERENCE
NUMERICAL

2 . . . Substrate
4 . . . Element Array

25

4a, 4b, 4c . . . Elements
6 . . . Pressure sensitive paper
10 . . . Substrate processing apparatus
21 . . . Pedestal upper portion
22 . . . Movable Pressurizing portion
220 . . . Through hole
221 . . . Center area
23 . . . Pedestal lower portion
24 . . . Guide Bush
25 . . . Guide shaft
30 . . . Generating portion
40 . . . Pressurizing portion
41 . . . Upper stage
42 . . . Lower stage
43 . . . Upper mounting portion
44 . . . Upper jig plate
45 . . . Support member
46 . . . Lower jig plate
460 . . . Center area
461 . . . Side area
462 . . . Joining depression
50a to 50g . . . Columnar members
500 . . . Collective body
510 . . . Penetrating hole
511 . . . Joining depression
52 . . . Installation portion
520 . . . Center Area
53 . . . Installation hole
530 . . . Joining depression
54a . . . Penetrating type joining member
54b . . . Non-penetrating type joining member
60 . . . Heat dissipating member
What is claimed:

1. A substrate processing apparatus comprising a lower jig plate for arranging an object to be pressurized,
   support member comprising columnar members supporting the lower jig plate and an installation portion for installing the columnar members, wherein
   the columnar members are placed to the installation portion in accordance with a in-plane distribution of a load applied to the lower jig plate,
   the installation portion has installation holes for installing the columnar members and
   diameters of the installation holes vary in accordance with the in-plane distribution of a load applied to the lower jig plate.

2. The substrate processing apparatus according to claim 1, wherein the installation holes are arranged concentrically.

3. The substrate processing apparatus according to claim 1, wherein one of the columnar members is joined to the lower jig plate by using a joining member.

4. The substrate processing apparatus according to claim 3, wherein the one of the columnar members joined to the lower jig plate by using the joining member is arranged under a pressurizing shaft for applying pressure to the object.

5. The substrate processing apparatus according to claim 3, wherein the one of the columnar members is joined to the lower jig plate and the installation portion by using the joining member.

6. The substrate processing apparatus according to claim 1, wherein the columnar members include at least one selected from a first columnar member and a second columnar member, in which
   the first columnar member is joined to the installation portion using a joining member and is provided to the lower jig plate without using the joining member, and
   the second columnar member is provided between the lower jig plate and the installation portion without using the joining member.

7. The substrate processing apparatus according to claim 6 further comprises a heat dissipating member and at least one of the first columnar member and the second columnar member is provided under the lower jig plate via the heat dissipating member.

8. A substrate processing apparatus comprising a lower jig plate for arranging an object to be pressurized,
   a support member comprising columnar members supporting the lower jig plate and an installation portion for installing the columnar members, wherein
   the columnar members are placed to the installation portion in accordance with a in-plane distribution of a load applied to the lower jig plate and
   one of the columnar members is joined to the lower jig plate by using a joining member.

9. The substrate processing apparatus according to claim 8, wherein the one of the columnar members joined to the lower jig plate by using the joining member is arranged under a pressurizing shaft for applying pressure to the object.

10. The substrate processing apparatus according to claim 8, wherein the one of the columnar members is joined to the lower jig plate and the installation portion by using the joining member.

11. A substrate processing apparatus comprising a lower jig plate for arranging an object to be pressurized,
   a support member comprising columnar members supporting the lower jig plate and an installation portion for installing the columnar members, wherein
   the columnar members are placed to the installation portion in accordance with a in-plane distribution of a load applied to the lower jig plate, and
   at least one of the columnar members is joined to the installation portion by using a joining member engaged inside at least one of the columnar members.

12. A substrate processing apparatus comprising a lower jig plate for arranging an object to be pressurized,
   a support member comprising columnar members supporting the lower jig plate and an installation portion for installing the columnar members, wherein
   the columnar members are placed to the installation portion in accordance with a in-plane distribution of a load applied to the lower jig plate,
   the installation portion has installation holes for installing the columnar members, and
   depths of the installation holes vary in accordance with the in-plane distribution of the load applied to the lower jig plate.

* * * * *